(12) United States Patent
Lee et al.

(10) Patent No.: US 11,254,698 B2
(45) Date of Patent: Feb. 22, 2022

(54) COBALT PRECURSOR AND METHODS FOR MANUFACTURE USING THE SAME

(71) Applicant: SAMSUNG ELECTRONICS CO., LTD., Suwon-si (KR)

(72) Inventors: Soyoung Lee, Hwasung-si (KR); Hiroshi Nihei, Hwasung-si (KR); Takamasa Miyazaki, Hwasung-si (KR); Yousuke Satou, Hwasung-si (KR); Kouhei Sugimoto, Hwasung-si (KR); Masashi Shirai, Hwasung-si (KR); Jaesoon Lim, Hwasung-si (KR); Younsoo Kim, Hwasung-si (KR); Younjoung Cho, Hwasung-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 225 days.

(21) Appl. No.: 16/702,791

(22) Filed: Dec. 4, 2019

(65) Prior Publication Data

US 2020/0339618 A1    Oct. 29, 2020

(30) Foreign Application Priority Data

Apr. 23, 2019    (KR) .................. 10-2019-0047222

(51) Int. Cl.
*C23C 16/18* (2006.01)
*H01L 21/02* (2006.01)
(Continued)

(52) U.S. Cl.
CPC .............. *C07F 15/06* (2013.01); *C23C 16/18* (2013.01); *C23C 16/45527* (2013.01);
(Continued)

(58) Field of Classification Search
CPC ... C23C 16/18; C07F 15/06; H01L 21/02274; H01L 21/02277; H01L 21/0228; H01L 21/3213
See application file for complete search history.

(56) References Cited

U.S. PATENT DOCUMENTS 6,444,263 B1    9/2002    Paranjpe et al.
9,028,917 B2 *  5/2015    Odedra ................ C23C 16/406
                                          427/250
(Continued)

FOREIGN PATENT DOCUMENTS

JP    2010-528183    8/2010
JP    2012-501543    1/2012
(Continued)

OTHER PUBLICATIONS

Lee et al., "High Quality Area-Selective Atomic Layer Deposition Co Using Ammonia Gas as a Reactant", Journal of The Electrochemical Society, 157, 2010, pp. D10-D15.
(Continued)

*Primary Examiner* — Elizabeth A Burkhart
(74) *Attorney, Agent, or Firm* — F. Chau & Associates, LLC

(57) ABSTRACT

The inventive concept relates to a cobalt precursor, a method for manufacturing a cobalt-containing layer using the same, and a method for manufacturing a semiconductor device using the same. More particularly, the cobalt precursor of the inventive concept includes at least one compound selected from the group consisting of a compound of Formula 1 and a compound of Formula 2.

15 Claims, 18 Drawing Sheets

(51) Int. Cl.
*H01L 21/3213* (2006.01)
*C07F 15/06* (2006.01)
*C23C 16/455* (2006.01)

(52) U.S. Cl.
CPC .... *H01L 21/0228* (2013.01); *H01L 21/02274* (2013.01); *H01L 21/02277* (2013.01); *H01L 21/3213* (2013.01)

(56) References Cited

U.S. PATENT DOCUMENTS

| | | | |
|---|---|---|---|
| 9,428,835 | B2 | 8/2016 | Machida et al. |
| 9,487,860 | B2* | 11/2016 | Gatineau ............... C23C 16/50 |
| 9,540,408 | B2 | 1/2017 | Peters |
| 2009/0029036 | A1 | 1/2009 | Dussarrat |
| 2009/0053426 | A1 | 2/2009 | Lu et al. |
| 2012/0164328 | A1* | 6/2012 | Kojima ............... C23C 18/1696 427/250 |
| 2012/0177845 | A1 | 7/2012 | Odedra et al. |
| 2013/0260555 | A1* | 10/2013 | Zope ............... H01L 21/4846 438/660 |
| 2016/0010204 | A1 | 1/2016 | Gatineau et al. |
| 2017/0032973 | A1 | 2/2017 | Baum et al. |
| 2017/0084486 | A1* | 3/2017 | Zope ............... H01L 21/76814 |
| 2017/0330797 | A1* | 11/2017 | Lai ............... C23C 16/452 |

FOREIGN PATENT DOCUMENTS

| | | |
|---|---|---|
| JP | 5600351 | 10/2014 |
| JP | 2016-513086 | 5/2016 |
| JP | 5919882 | 5/2016 |
| JP | 2017-007975 | 1/2017 |
| KR | 10-1587509 | 1/2016 |
| KR | 10-2018-0000418 | 1/2018 |

OTHER PUBLICATIONS

Happ et al., "On the Reactivity of Acetylenes Coordinated to Cobalt. 9. Effects of Substitution and Coordination on the 13C-NMR Chemical Shifts of the sp Carbons of (.mu.2-R1C2R2)Co2(CO)6 Complexes. Molecular Structure of (.mu.2-PhC2SiPh3)Co2(CO)6", Organometallics, 1995,14, pp. 809-819.

Barreca et al., "Composition and Microstructure of Cobalt Oxide Thin Films Obtained from a Novel Cobalt(ll) Precursor by Chemical Vapor Deposition", Chem. Mater. 2001, 13, pp. 588-593.

Greenfield et al., "Acetylenic Dicobalt Hexacarbonyls. Organometallic Compounds Derived from Alkynes and Dicobalt Octacarbonyl12", J. Am. Chem. Soc. 1956, 78, 1, pp. 120-124.

Chatani et al., "A New Entry to v-Allylcobalt Tricarbonvis Using (CH3)3SiCo(CO)4". Tetrahedron Letters.vol. 24, No. 50, 1983, pp. 5649-5652.

Kim et al., "Characteristics of Cobalt Thin Films Deposited by Remote Plasma ALD Method with Dicobalt Octacarbonyl", Journal of The Electrochemical Society, 154 3, 2007, pp. H177-H181.

Antras et al., "Pauson-Khand Reaction of Allenic Hydrocarbons: Synthesis of 4-Alkylidenecyclopentenones", 2010, Eur. J. Org. Chem. 2010, pp. 3312-3336.

\* cited by examiner

COBALT PRECURSOR AND METHODS FOR MANUFACTURE USING THE SAME

CROSS-REFERENCE TO RELATED APPLICATIONS

This application claims priority under 35 U.S.C. § 119 of Korean Patent Application No. 10-2019-0047222, filed on Apr. 23, 2019 in the Korean Intellectual Property Office, the disclosure of which is incorporated by reference in its entirety herein.

1. TECHNICAL FIELD

The present disclosure herein relates to a cobalt precursor, a method for manufacturing a cobalt-containing layer using the same, and a method for manufacturing a semiconductor device using the same.

2. DISCUSSION OF RELATED ART

Semiconductor devices are used for a wide array of electronic devices in many different industries due to their advantages, including the characteristics of miniaturization, multifunctionalization and/or low manufacturing costs. Semiconductor devices may include memory devices storing data, logic devices for data processing, hybrid devices that may perform various functions at the same time, etc.

The requirement for semiconductor devices to be highly integrated has increased as electronic industries have become highly developed. Accordingly, eliminating various defects such as the decrease of the process margin of an exposing process defining minute patterns, and the efficient and precise manufacture of semiconductor devices have become increasingly difficult in addition, as electronic industries have developed, the requirement for semiconductor devices to have a high speed has increased. In order to satisfy such requirements on the high integration and/or high speed of semiconductor devices, various studies have been conducted.

SUMMARY

The present disclosure provides a novel cobalt precursor.

The present disclosure also provides a method for manufacturing a cobalt-containing layer using the novel cobalt precursor.

An exemplary embodiment of the present inventive concepts provides a cobalt precursor including at least one compound selected from the group consisting of a compound of the following Formula 1 and a compound of the following Formula 2:

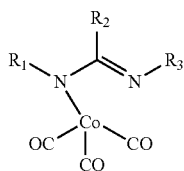

[Formula 1]

R1 and R3 are each independently substituted or unsubstituted, linear or branched (C1-C6)alkyl, and R2 is hydrogen, or substituted or unsubstituted, linear or branched (C1-C6)alkyl.

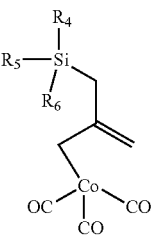

[Formula 2]

R4, R5 and R6 are each independently substituted or unsubstituted, linear or branched (C1-C6)alkyl.

In an exemplary embodiment of the present inventive concepts, there is provided a method for manufacturing a cobalt-containing layer including performing a deposition process using a cobalt precursor selected from the group consisting of the compound of Formula 1 and the compound of Formula 2.

In an exemplary embodiment of the present inventive concepts, there is provided a method for manufacturing a semiconductor device including forming an interlayer insulating layer on a substrate; patterning the interlayer insulating layer to form a recess; and forming a cobalt-containing layer on the recess. The forming of the cobalt-containing layer may include performing a deposition process using a cobalt precursor selected from the group consisting of the compound of Formula 1 and the compound of Formula 2.

In an exemplary embodiment of the present inventive concepts, there is provided a method for manufacturing a cobalt precursor comprising at least one compound selected from the group consisting of a compound of Formula 1 and a compound of Formula 2. The method includes at least one of: mixing together a compound of Formula 5 and a compound of Formula 6 to obtain the compound of Formula 1; and mixing together a compound of Formula 7 and a compound of Formula 8 to obtain the compound of Formula 2.

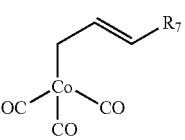

[Formula 5]

wherein R7 may by hydrogen or linear or branched (C1-C6)alkyl,

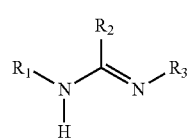

[Formula 6]

wherein R1 and R3 are each independently linear or branched (C1-C6)alkyl; and R2 is hydrogen, or linear or branched (C1-C6)alkyl,

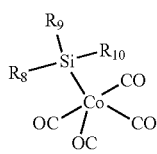

[Formula 7]

wherein R8, R9 and R10 are each independently linear or branched (C1-C6)alkyl,

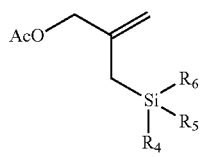

[Formula 8]

wherein R4, R5 and R6 are each independently linear or branched (C1-C6)alkyl; and AcO is acetoxy.

BRIEF DESCRIPTION OF THE DRAWINGS

The accompanying drawings are included to provide a further understanding of the present inventive concepts, and are incorporated in and constitute a part of this specification. The drawings illustrate exemplary embodiments of the present inventive concepts and, together with the description, serve to explain principles of the present inventive concepts. In the drawings.

DETAILED DESCRIPTION OF THE EXEMPLARY EMBODIMENTS

Figure 1:
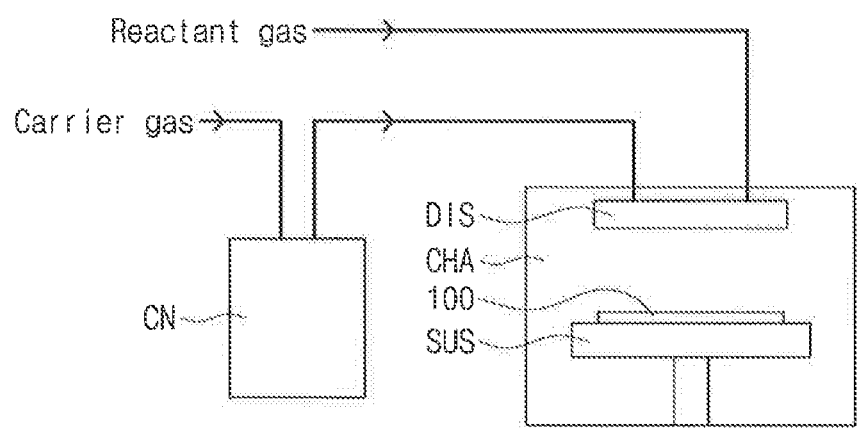
FIG. 1 is a diagram schematically showing a deposition apparatus for manufacturing a cobalt-containing layer according to an exemplary embodiment of the present inventive concepts.
Figure 2:
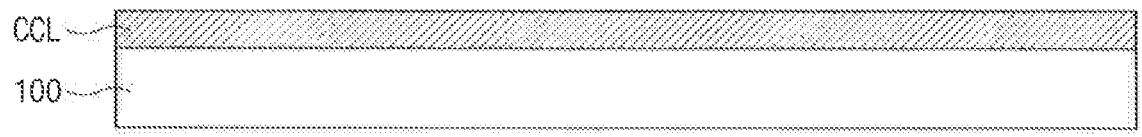
FIG. 2 is a cross-sectional view of a substrate having a cobalt-containing layer formed thereon according to an exemplary embodiment of the present inventive concepts.

FIG. 1 is a diagram schematically showing a deposition apparatus for manufacturing a cobalt-containing layer according to an exemplary embodiment of the present inventive concepts. FIG. 2 is a cross-sectional view of a substrate having a cobalt-containing layer formed thereon according to exemplary embodiments of the present inventive concepts.

Referring to FIG. 1 and FIG. 2, a cobalt-containing layer CCL may be formed on a substrate 100. In an exemplary embodiment, the formation of the cobalt-containing layer CU, on the substrate 100 may be performed by chemical vapor deposition (CVD) or atomic layer deposition (ALD). For example, the CVD may be thermal CVD, plasma-enhanced (PE) CVD, photo CVD or photoplasma CVD.

As shown in FIG. 1, the substrate 100 may be provided in a process chamber CHA. In an exemplary embodiment, the substrate 100 may be disposed on a susceptor SUS in the process chamber CHA. The susceptor SUS may support the substrate 100. In an embodiment, the susceptor SUS may rotate the substrate 100.

A cobalt precursor may be supplied on the substrate 100. For example, the cobalt precursor may be received in a container CN that is outside of the process chamber CHA and is fluidly connected with the process chamber CHA by connection means known in the art. In an exemplary embodiment, the cobalt precursor in the container CN may be vaporized at a temperature of about −10° C. to about 100° C. For example, the cobalt precursor in the container CN may be vaporized at a temperature of about 0° C. to about 40° C.

In an exemplary embodiment, the vaporized cobalt precursor may be supplied into the process chamber CHA through a carrier gas supplied into the container CN. For example, the carrier gas may be an inert gas such as argon, helium and neon. The process chamber CHA may include a distributing plate DIS that is configured to uniformly spray the cobalt precursor into the process chamber.

The cobalt precursor may be at least one compound selected from a compound of the following Formula 1 and a compound of the following Formula 2:

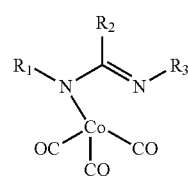

[Formula 1]

R1 and R3 may be each independently linear or branched (C1-C6)alkyl. In an exemplary embodiment, the (C1-C6) alkyl of R1 and R3 may be each independently unsubstituted or substituted with halogen, a hydroxyl group, a nitro group, an imino group, a (C1-C20)alkyl group, a (C6-C20)aryl group, or a (C7-C21)arylalkyl group. R2 may be hydrogen, or a linear or branched (C1-C6)alkyl.

In an exemplary embodiment, R1 and R3 may be each independently branched (C3-C6)alkyl, and R2 may be hydrogen or branched (C1-C3)alkyl. In an exemplary embodiment, R1 and R3 may be each independently branched (C3-C4)alkyl, and R2 may be (C1-C2)alkyl.

[Formula 2]

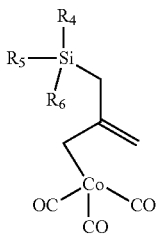

R4, R5 and R6 may be each independently linear or branched (C1-C6)alkyl. The (C1-C6)alkyl of R4, R5 and R6 may be unsubstituted or substituted with halogen, a hydroxyl group, a nitro group, an imino group, a (C1-C20) alkyl group, a (C6-C20)aryl group, or a (C7-C21)arylalkyl group. In an exemplary embodiment, R4, R5 and R6 may be each independently (C1-3)alkyl. For example, R4, R5 and R6 may be each independently (C1-C2)alkyl.

In an exemplary embodiment, the cobalt precursor may solely be at least one compound of Formula 1. In another exemplary embodiment, the cobalt precursor may solely be at least one compound of Formula 2. In another exemplary embodiment, the cobalt precursor may be a mixture of at least one compound of Formula 1 and at least one compound of Formula 2.

In an exemplary embodiment, the compound of Formula 1 may be a compound of Formula 3 below. In Formula 3 below, each of R1 and R3 of Formula 1 may be tertiary butyl (tBu), and R2 may be methyl. Due to the inclusion of tertiary butyl (tBu) in the compound of Formula 3, the cobalt precursor may be present in a liquid phase in the container CN, and thus, the deposition process may be easily performed.

[Formula 3]

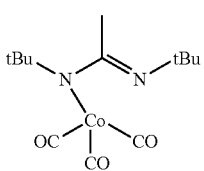

In an exemplary embodiment, the compound of Formula 2 may be a compound of Formula 4 below. In Formula 4, each of R4, R5 and R6 of Formula 2 may be methyl. Due to the inclusion of trimethylsilyl in the compound of Formula 4, the cobalt precursor may be present in a liquid phase in the container CN, and thus the deposition process may be easily performed. Further, since each of R4, R5 and R6 of Formula 2 is methyl, the cobalt-containing layer CCL manufactured using the compound of Formula 4, may have a relatively small carbon content.

[Formula 4]

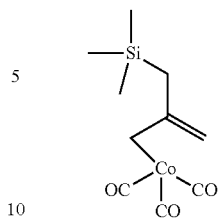

The cobalt precursor may be stored by itself in the container CN. However, in some embodiments the cobalt precursory may be stored in the container CN in a solution state. For example, the cobalt precursor may be stored in the container CN in a dissolved state in an organic solvent. In some exemplary embodiments, the organic solvent may be an aliphatic hydrocarbon such as hexane, an aromatic hydrocarbon such as toluene, an ether such as glyme, etc.

A reactant gas may be supplied on the substrate 100. The reactant gas may be sprayed via the distributing plate DIS on the substrate 100. In an exemplary embodiment, the reactant gas may be sprayed concurrently with the cobalt precursor gas on the substrate 100. In another exemplary embodiment, the cobalt precursor may be first sprayed on the substrate 100, and the reactant gas may subsequently be sprayed on the substrate 100 after the cobalt precursor has been sprayed.

In an exemplary embodiment, the reactant gas may include at least one selected from the group consisting of hydrogen ($H_2$), oxygen ($O_2$), ozone ($O_3$), nitrogen dioxide ($NO_2$), nitrogen monoxide (NO), vapor ($H_2O$), hydrogen peroxide ($H_2O_2$), acetic acid, hydrazine ($N_2H_4$), ammonia ($NH_3$), silane ($SiH_4$), boran ($BH_3$), diboran ($B_2H_6$) and phosphine ($PH_3$).

During the deposition process of the cobalt-containing layer CCL, the pressure in the process chamber CHA may be from about 0.001 kPa to about 200 kPa. For example, the pressure in the process chamber CHA may be from about 0.01 kPa to about 110 kPa. The temperature of the substrate 100 on the susceptor SUS may be from about 80° C. to about 400° C. For example, the temperature of the substrate 100 on the susceptor SUS may be from about 100° C. to about 300° C.

Referring to FIGS. 1-2, the cobalt-containing layer CCL may be formed on the substrate 100 from the cobalt precursor by performing the deposition process explained with reference to FIG. 1. In an exemplary embodiment, if hydrogen is used as the reactant gas, a cobalt metal layer may be formed. The cobalt (Co) content in the cobalt-containing layer CCL may be about 95 wt % or more. The carbon content in the cobalt-containing layer CCL may be from about 1 wt % to about 3 wt %. In another exemplary embodiment, if a gas containing oxygen (O) (for example, $O_2$) is used as the reactant gas, a cobalt oxide layer may be formed.

Figure 3:
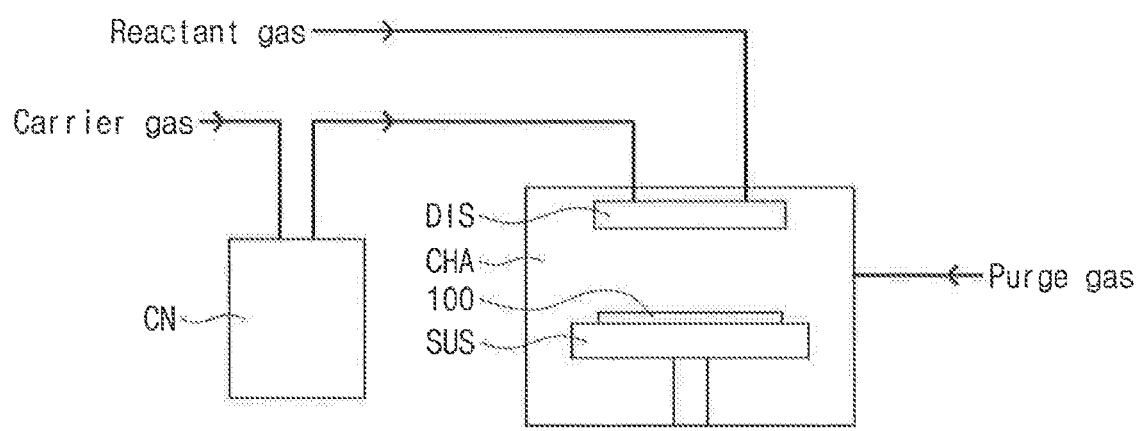
FIG. 3 is a diagram schematically snowing a deposition apparatus for manufacturing a cobalt-containing layer according to an exemplary embodiment of the present inventive concepts.

FIG. 3 is a diagram schematically showing a deposition apparatus for manufacturing a cobalt-containing layer according to an exemplary embodiment of the present inventive concepts.

Referring to FIG. 2 and FIG. 3, the formation of the cobalt-containing layer CCL on the substrate 100 may include performing an atomic layer deposition (ALD) process. The performance of the ALD process may include performing a cycle multiple times. The cycle may include a first step of supplying a cobalt precursor on a substrate 100, a second step of purging, a third step of supplying a reactant gas on the substrate 100, and a fourth step of purging. The purge process may be a process known in the art. The first to fourth steps may be performed consecutively in separate, discrete steps. By performing the cycle repeatedly, the cobalt-containing layer CCL may be formed on the substrate 100.

Figure 4:
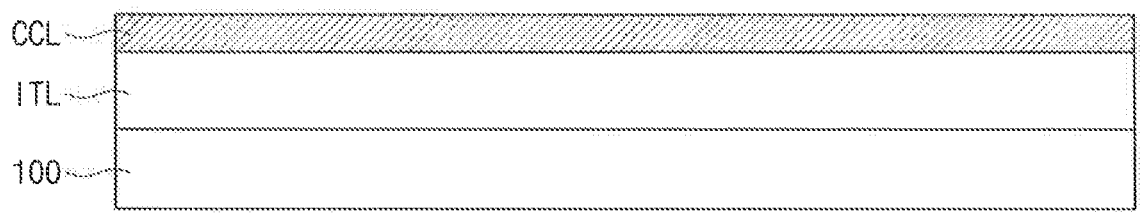
FIG. 4 is a cross-sectional view of a substrate having a cobalt-containing layer and an intermediate layer formed thereon according to an exemplary embodiment of the present inventive concepts.
Figure 5:
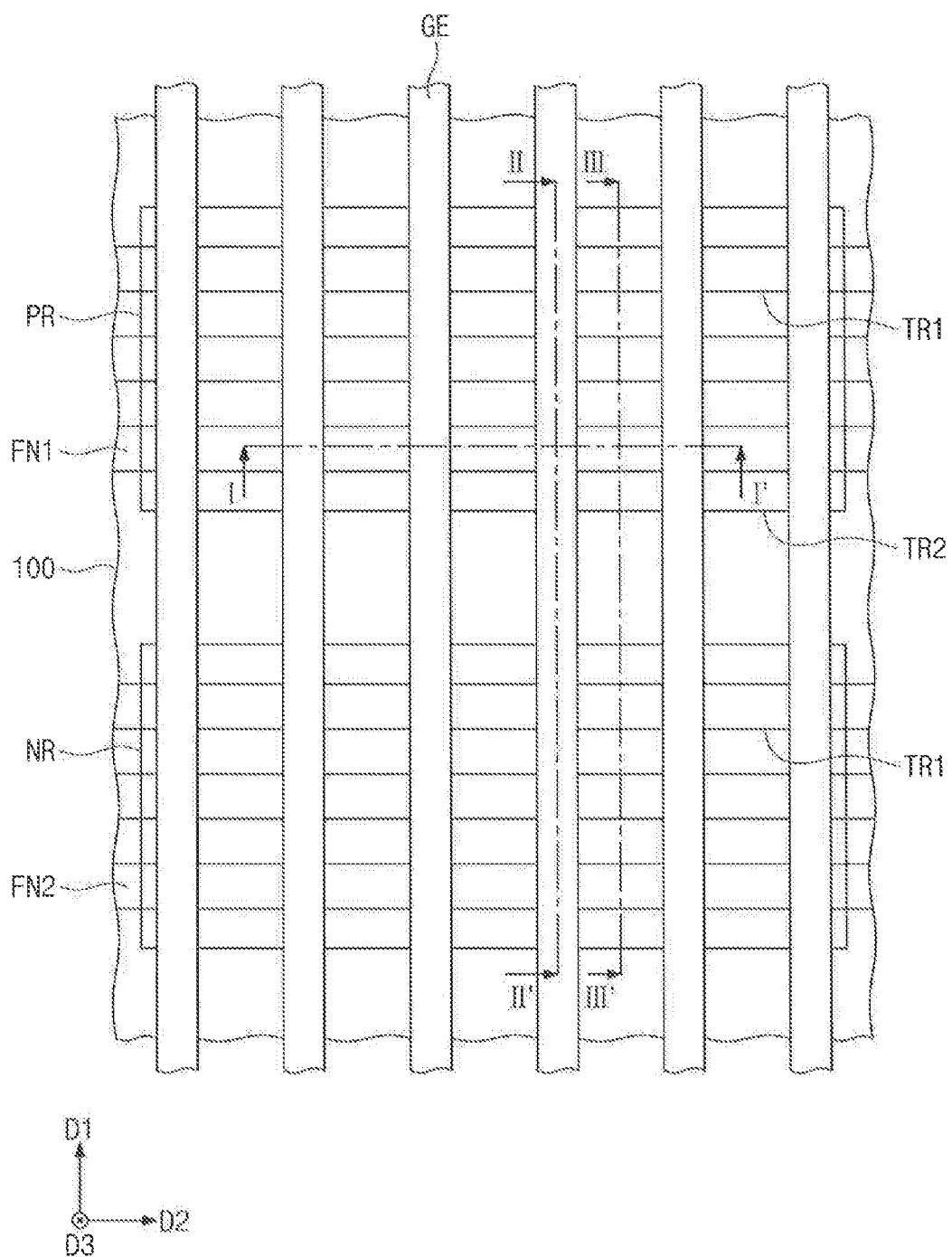
FIG. 5, FIG. 7, FIG. 9, FIG. 11 and FIG. 13 are plan views for devices according to exemplary embodiments of the present inventive concepts.
Figure 6A:
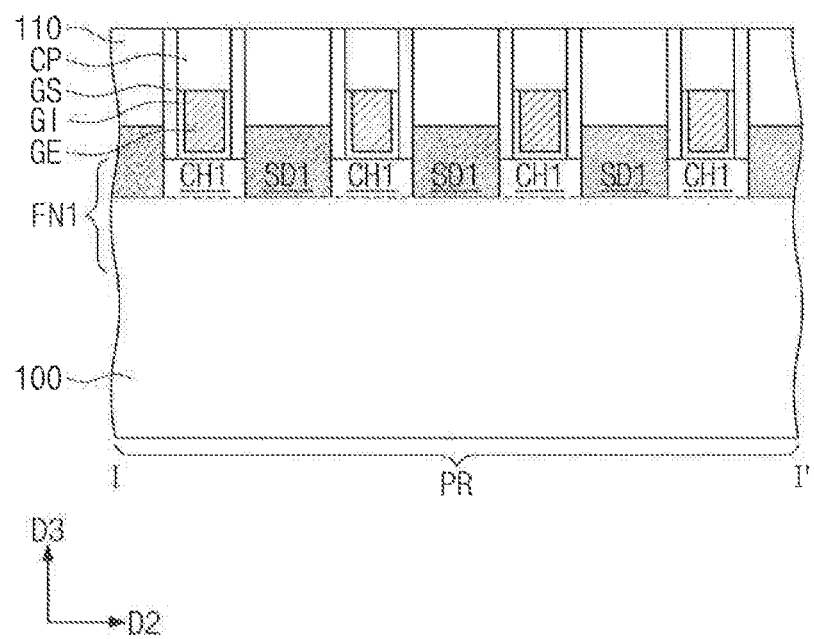
FIG. 6A, FIG. 8A, FIG. 10A, FIG. 12A and FIG. 14A are cross-sectional views of the devices along lines I-I' of FIG. 5, FIG. 7, FIG. 9, FIG. 11 and FIG. 13, respectively according to exemplary embodiments of the present inventive concepts.
Figure 6B:
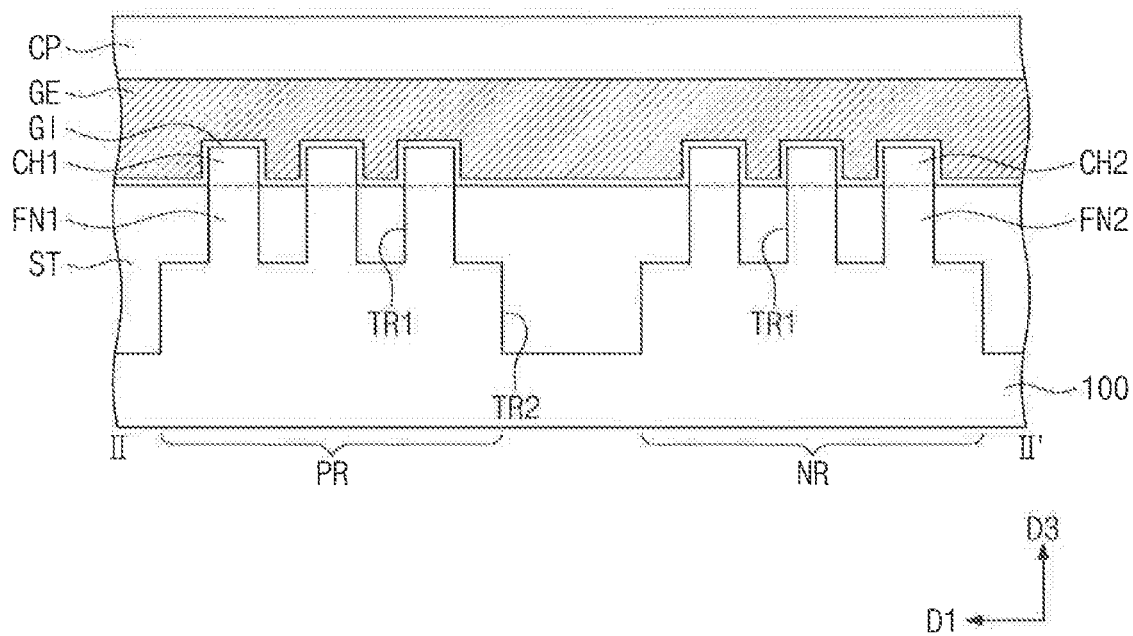
FIG. 6B, FIG. 8B, FIG. 10B, FIG. 12B and FIG. 14B are cross-sectional views of the devices along lines II-II' of FIG. 5, FIG. 7, FIG. 9, FIG. 11 and FIG. 13, respectively according to exemplary embodiments of the present inventive concepts.
Figure 6C:
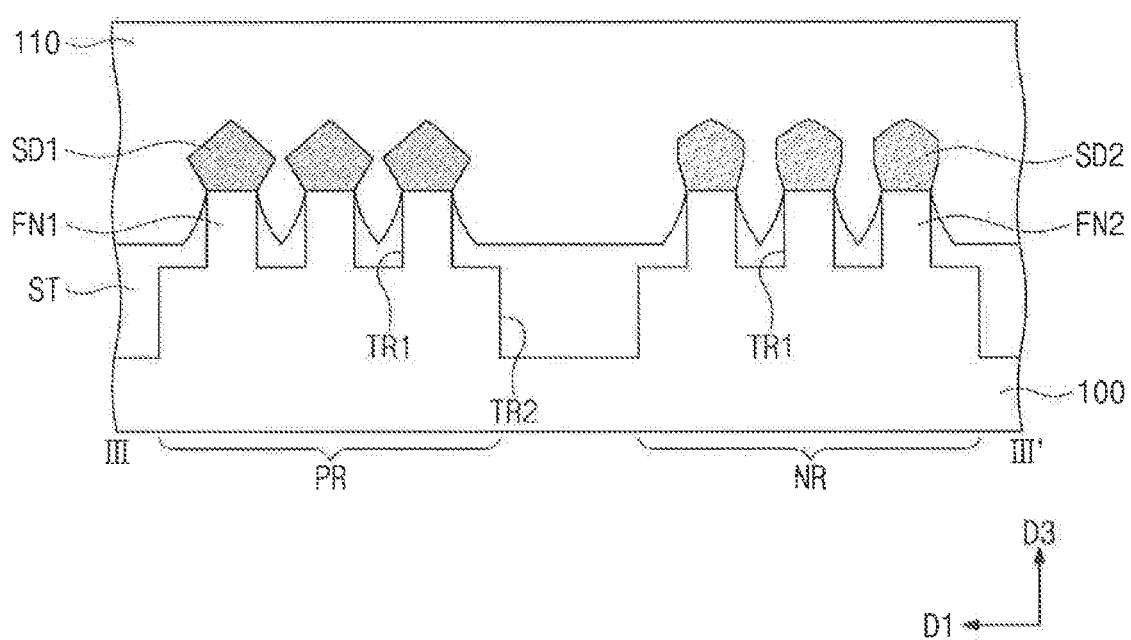
FIG. 6C, FIG. 8C, FIG. 10C, FIG. 12C and FIG. 14C are cross-sectional views of the devices along lines III-III' of FIG. 5, FIG. 7, FIG. 9, FIG. 11 and FIG. 13, respectively according to exemplary embodiments of the present inventive concepts.
Figure 7:
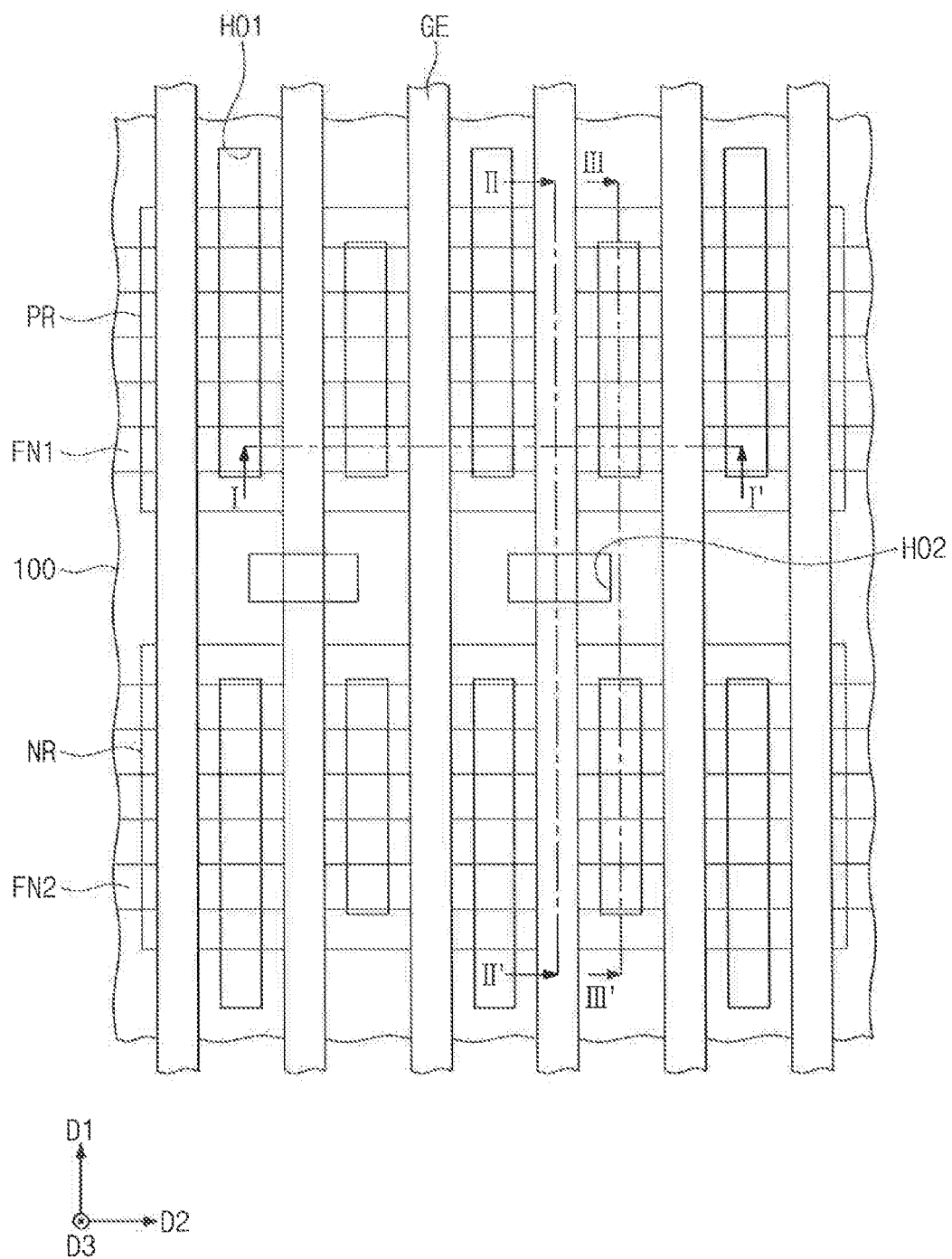

FIG. 4 is a cross-sectional view of a substrate having a cobalt-containing layer and an intermediate layer formed thereon according to an exemplary embodiment of the present inventive concepts.

Referring to FIG. 4, the cobalt-containing layer CCL may be formed on an intermediate layer disposed on the substrate 100 and may not be formed directly on the substrate 100. In an exemplary embodiment, the intermediate layer ITL may be formed directly on the substrate 100. However, in other embodiments, at least one intervening layer may be disposed between the intermediate layer ITL and the substrate 100.

In an exemplary embodiment, the intermediate layer ITL may include a silicon oxide layer, a silicon nitride layer, a copper oxide layer, a titanium nitride layer, a titanium oxide layer, a tantalum nitride layer, a tantalum oxide layer, a ruthenium oxide layer, a zirconium oxide layer, a hafnium oxide layer or a lanthanum oxide layer. In another exemplary embodiment, the intermediate layer may include a metal layer such as copper, titanium, tantalum, and ruthenium.

In an exemplary embodiment, a method for preparing the compound of Formula 1 may be as follows.

A compound of the following Formula 5 and a compound of the following Formula 6 may be prepared:

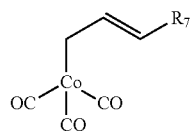

[Formula 5]

R7 may be hydrogen or linear or branched (C1-C6)alkyl. In an exemplary embodiment, R7 may be hydrogen, and in this case, allyl (C=C—C—) may be connected with cobalt (Co).

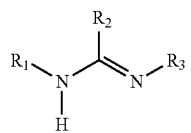

[Formula 6]

R1 and R3 may be each independently linear or branched (C1-C6)alkyl. R2 may be hydrogen, or linear or branched (C1-C6)alkyl.

After preparation of the compounds of Formula 5 and Formula 6, the compounds may be combined to form a reaction. For example, the compound of Formula 5, the compound of Formula 6 and an organic solvent may be combined, such as by being mixed and stirred together. The compound of Formula 5 and the compound of Formula 6 may react to produce the compound of Formula 1. The molar ratio of the compound of Formula 5 with respect to the compound of Formula 6 may be from 0.4 to 1.4. For example, the molar ratio of the compound of Formula 5 with respect to the compound of Formula 6 may be from 0.6 to 1.2. The reaction temperature may be from about −100° C. to about 100° C. For example, the reaction temperature may be from about −80° C. to about 40° C.

In an exemplary embodiment, a method for preparing the compound of Formula 2 may be as follows.

A compound of the following Formula 7 and a compound of the following Formula 8 may be prepared:

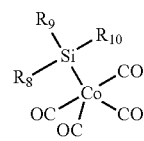

[Formula 7]

R8, R9 and R10 may be each independently linear or branched (C1-C6)alkyl.

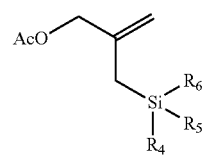

[Formula 8]

R4, R5 and R6 may be each independently linear or branched (C1-C6)alkyl, AcO may be acetoxy.

After the compounds of Formula 7 and Formula 8 are prepared, the compounds may be combined to form a reaction. For example, the compound of Formula 7, the compound of Formula 8 and an organic solvent may be mixed and stirred. However, in other exemplary embodiments, the organic solvent may be omitted. The compound of Formula 7 and the compound of Formula 8 may react to produce the compound of Formula 2. The molar ratio of the compound of Formula 7 with respect to the compound of Formula 8 may be from 0.1 to 1.6. For example, the molar ratio of the compound of Formula 7 with respect to the compound of Formula 8 may be from 0.5 to 1.2. The reaction temperature may be from about −100° C. to about 100° C. For example, the reaction temperature may be from about −80° C. to about 40° C.

The organic solvent used in the preparation method of the compound of Formula 1 and the preparation method of the compound of Formula 2 may be selected from the group consisting of ethers, such as diethyl ether and tetrahydrofuran, aliphatic hydrocarbons, such as hexane and heptanes, aromatic hydrocarbons, and mixtures thereof. The mass ratio of the organic solvent with respect to the compound of Formula 5 or the compound of Formula 7 may be from 1 to 100. For example, the mass ratio of the organic solvent with respect to the compounds of Formula 5 or Formula 7 may be from 1 to 50.

The compound used in the preparation method of the compound of Formula 1 and the preparation method of the compound of Formula 2 may include carbonyl cobalt. Since carbonyl cobalt is unstable and may easily react with vapor and oxygen in the air, the reaction may preferably be performed in an inert gas.

Example 1: Synthesis of Compound of Formula 3

The compound of Formula 3 explained above was prepared as follows.

17.1 g (50.0 mmol) of octacarbonyl dicobalt and 150 ml of diethyl ether were added to a 1 L flask provided with a stirring apparatus, a thermometer and a dropping funnel. The octacarbonyl dicobalt used may be a commercial product.

100 ml (100 mmol) of 1.0 M lithium triethylborohydride solution (solvent: tetrahydrofuran) was dropped into the solution in the flask through the dropping funnel. The temperature was maintained from about 6° C. to about 8° C.

The solution in the flask was stirred at room temperature for about 3 hours. After finishing the reaction, the reaction solution was concentrated at a temperature of about 50° C. under a pressure of about 133.3 Pa to obtain a residue. The Chemical reaction that occurred above is shown in the following Reaction 1:

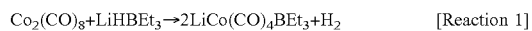

Co$_2$(CO)$_8$+LiHBEt$_3$→2LiCo(CO)$_4$BEt$_3$+H$_2$     [Reaction 1]

Et is ethyl.

200 ml of diethyl ether and 12.1 g (100 mmol) of allyl bromide were added to the residue thus obtained in Reaction 1, and stirred at room temperature. After finishing the reaction, the reaction solution was concentrated at a temperature of about 0° C. under a pressure of about 133.3 Pa, and the residue obtained was extracted with pentane and filtered using celite.

The filtrate solution was concentrated at a temperature of about 0° C. under a pressure of about 133.3 Pa and the concentrate was distilled under a reduced pressure in an oil bath of about 40° C. and a pressure of about 13.3 hPa. 13.1 g of allyl tricarbonyl cobalt was obtained in a liquid phase. A yield percentage of 71% was achieved.

The chemical reaction that occurred above is shown in the following Reaction 2:

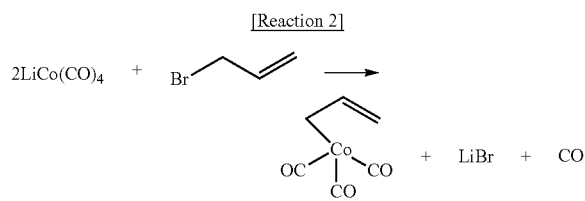

The analysis results of the allyl tricarbonyl cobalt compound thus obtained in Reaction 2 are as follows.

(1) 1H NMR (Benzene-d6); Chemical shift (H number, multiplicity); 1.64 (2H, d), 2.52 (2H, s), 4.23 (1H, m)

(2) Atmospheric pressure TG-DTA: T1/2: 78° C., residue <1 wt %

7.17 g (39.0 mmol) of the allyl tricarbonyl cobalt obtained in Reaction 2 and 75 ml of tetrahydrofliran were added to a 200 ml flask. 6.6 g (38.8 mmol) of di-tert-butylacetoamidine was added to the solution in the flask. The solution was stirred for about 4 hours. After finishing the reaction, the reaction solution was concentrated, and the concentrate was distilled under a reduced pressure of about 45° C. and about 133.3 Pa. 7.40 g of di-tert-butyl(aceto)amidinate)tricarbonyl cobalt was obtained as an orange liquid (yield: 61%).

The chemical reaction that occurred above is shown in the following Reaction 3:

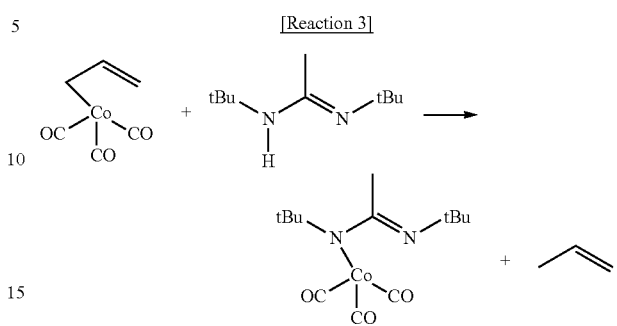

tBu is tertiary butyl.

The analysis results of the di-tert-butyl(aceto)amidinate) tricarbonyl cobalt compound thus obtained in Reaction 3 are as follows.

(1) 1H NMR (Benzene-d6); Chemical shift (H number, multiplicity); 1.36 (18H, s), 1.40 (3H, s)

(2) Atmospheric pressure TG-DTA: T1/2: 104° C., residue <1 wt %

(3) Boiling point: 210° C.

Example 2: Synthesis of Compound of Formula 4

The compound of Formula 4 explained above was prepared as follows.

2.0 g (5.8 mmol) of dicobalt octacarbonyl and 4.8 g of toluene were added to a 30 ml flask, and mixed. 2.3 g (11.6 mmol) of tributylsilane was added to the solution in the flask. The solution was stirred at room temperature overnight. After finishing the reaction, the reaction solution was distilled under a reduced pressure to obtain 4.3 g of tributylsilyl cobalt tetracarbonyl, a reddish brown liquid. A yield percentage of 100% was achieved.

The chemical reaction that occurred above is shown in the following Reaction 4:

Co$_2$(CO)$_8$+HSi-nBu$_3$→2 nBu$_3$-SiCo(CO)$_4$+H$_2$     [Reaction 4]

nBu is normal butyl.

The analysis results of the tributylsilyl cobalt tetracarbonyl compound thus obtained in Reaction 4 are as follows.

(1) 1H NMR (Benzene-d6); Chemical shift (H number, multiplicity); 0.88 (15H, m), 1.31 (12H, m).

4.3 g (11.7 mmol) of the tributylsilyl cobalt tetracarbonyl thus obtained in Reaction 4 and 2.3 g (12.3 mmol) of 2-[(acetoxymethyl)allyl]trimethylsilane were added to a 30 ml flask. The solution in the flask was stirred at about 70° C.; for about 2 hours. After finishing the reaction, the reaction solution was distilled under a reduced pressure in an oil bath of about 70° C. and a pressure of about 100 Pa. 2.1 g of a compound of Formula 4 was obtained as an orange liquid. A yield percentage of 61% was achieved.

The chemical reaction that occurred above is shown in the following Reaction 5:

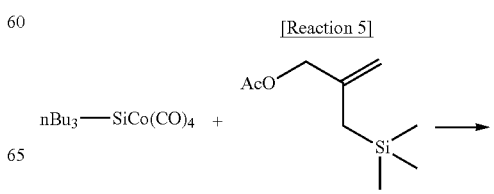

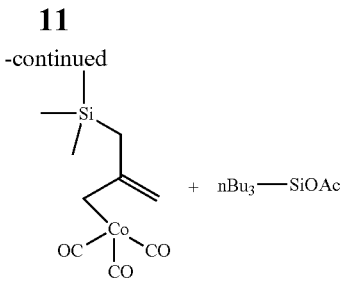

AcO or OAc is acetoxy.

The analysis results of the compound of Formula 4 thus obtained in Reaction 5 are as follows.

(1) 1H NMR (Benzene-d6); Chemical shift (H number, multiplicity); 0.87 (9H, s), 1.24 (2H, s), 1.81. (2H, s), 2.76 (2H, s)

(2) Atmospheric pressure TG-DTA: T1/2: 143° C., residue 6 wt %

(3) Boiling point: 260° C.

Comparative Example 1: Synthesis of CCTBA (t-butylacetylene)dicobalthexacarbonyl (CCTBA) was prepared as follows.

25.0 g (73.1 mmol) of dicobalt octacarbonyl and 200 ml of diethyl ether were added to a 500 ml flask and stirred for about 1 hour in an argon atmosphere. 6.61 g (80.4 mmol) of t-butylacetylene was slowly dropped while stirring the solution at about 20° C. for about 3 hours to perform the reaction. After finishing the reaction, the reaction solution was concentrated under a reduced pressure, and the concentrate was distilled at a temperature of about 70° C. under a pressure of about 13.3 Pa. 19.12 g of CCTBA was obtained as a dark red liquid. A yield percentage of 71% was achieved.

The analysis results of the compound thus obtained, CCTBA, are as follows.

(1) 1H NMR (Benzene-d6); Chemical shift (H number, multiplicity); 1.06 (9H, s), 5.45 (1H, s)

(2) Atmospheric pressure TG-DTA: T1/2: 155° C., residue 8 wt %

Example 3: Manufacture of Cobalt-Containing Layer

Thermal CVD was performed using a deposition apparatus explained referring to FIG. 1 above. A silicon oxide layer substrate ($SiO_2$/Si) having a size of 20 mm×20 mm was loaded in a chamber CHA. The compound of Formula 3 prepared in Example 1 was added as a cobalt precursor in the container CN. The cobalt precursor in the container CN was vaporized at a temperature of about 5° C. The flow rate of a carrier gas (e.g., argon) was controlled to about 10 ml/min. The vaporized cobalt precursor together with a reactant gas (e.g., hydrogen) was supplied onto the silicon oxide layer substrate in the chamber CHA. The flow rate of hydrogen was controlled to about 500 ml/min. During the performance of the deposition process, the substrate was heated to about 110° C. and this temperature was maintained throughout the deposition process. The pressure in the process chamber CHA was maintained to about 2 kPa throughout the deposition process. The deposition process was performed for about 10 minutes.

Example 4: Manufacture of Cobalt-Containing Layer

Thermal CVD was performed using a deposition apparatus explained referring to FIG. 1 above. A silicon oxide layer substrate was loaded in a chamber CHA. The compound of Formula 4 prepared in Example 2 was added as a cobalt precursor in the container CN. The cobalt precursor in the container CN was vaporized at a temperature of about 20° C. The flow rate of a carrier gas (e.g., argon) was controlled to about 10 ml/min. The vaporized cobalt precursor together with a reactant gas (e.g., hydrogen) was supplied onto the silicon oxide layer substrate in the chamber CHA. The flow rate of hydrogen was controlled to about 500 ml/min. During the performance of the deposition process, the substrate was heated to about 110° C. and this temperature was maintained throughout the deposition process. The pressure in the process chamber CHA was maintained to about 1.333 kPa throughout the deposition process. The deposition process was performed for about 10 minutes.

Comparative Example 2: Manufacture of Cobalt-Containing Layer

Thermal CND was performed using a deposition apparatus as explained in FIG. 1 above. A silicon oxide layer substrate was loaded in a chamber CHA. The CCTBA compound prepared in Comparative Example 1 was added as a cobalt precursor in the container CN. The cobalt precursor in the container CN was vaporized at a temperature of about 40° C. The flow rate of a carrier gas (e.g., argon) was controlled to about 10 ml/min. The vaporized cobalt precursor together with a reactant gas (e.g., hydrogen) was supplied onto the silicon oxide layer substrate in the chamber CHA. The flow rate of hydrogen was controlled to about 500 ml/min. During the performing of the deposition process, the substrate was heated to about 175° C. and this temperature was maintained throughout the process. The pressure in the process chamber CHA was maintained to about 2 kPa throughout the process. The deposition process was performed for about 5 minutes.

The thickness and components of each of the cobalt-containing layers manufactured according to Example 3, Example 4 and Comparative Example 2 were analyzed and are listed in Table 1 below. The analysis of the components was performed using an X-ray photoelectron spectroscopy (XPS) measurement apparatus. The layer thickness was measured using a thickness measuring apparatus by reflection spectroscopy.

TABLE 1

| Layer | Layer thickness (nm) | Component |
|---|---|---|
| Cobalt-containing layer of Example 3 | 52 | carbon 1.0 wt % oxygen 0.9 wt % cobalt 98.1 wt % |
| Cobalt-containing layer of Example 4 | 76 | carbon 1.9 wt % oxygen 2.5 wt % cobalt 95.6 wt % |
| Cobalt-containing layer of Comparative Example 2 | 72 | carbon 3.6 wt % oxygen 0.4 wt % cobalt 96.0 wt % |

Since the CCTBA compound of Comparative Example 1 has a relatively low vapor pressure, this compound was vaporized at a temperature of about 40° C. In contrast, the compound of Formula 1 and the compound of Formula 2 of the present inventive concepts as shown in Examples 1 and 2 had relatively high vapor pressures, and these compounds were vaporized at temperatures of about 5° C. and about 20° C., respectively. Therefore, the deposition process of the cobalt precursor according to the present inventive concepts may be performed at a relatively low temperature.

Further, the cobalt-containing layer of Example 3 and the cobalt-containing layer of Example 4 had smaller carbon contents than the cobalt-containing layer of Comparative Example 2. In other words, the cobalt-containing layer according to the present inventive concepts has a smaller impurity (carbon) content than Comparative Example 2. Therefore, the electrical properties (e.g., low resistance property, etc.) may be improved.

FIG. 5, FIG. 7, FIG. 9, FIG. 11 and FIG. 13 are plan views for devices according to exemplary embodiments of the present inventive concepts. FIG. 6A, FIG. 8A, FIG. 10A, FIG. 12A and FIG. 14A are cross-sectional views of the devices along lines of FIG. 5, FIG. 7, FIG. 9, FIG. 11 and FIG. 13, respectively. FIG. 6B, FIG. 8B, FIG. 10B, FIG. 12B and FIG. 14B are cross-sectional views of the devices along lines II-II' of FIG. 5, FIG. 7, FIG. 9, FIG. 11 and FIG. 13, respectively. FIG. 6C, FIG. 8C, FIG. 10C, FIG. 12C and FIG. 14C are cross-sectional views of the devices along lines III-III' of FIG. 5, FIG. 7, FIG. 9, FIG. 11 and FIG. 13, respectively.

Referring to FIG. 5 and FIG. 6A to FIG. 6C, a substrate 100 may be provided. In an exemplary embodiment, the substrate 100 may be a silicon substrate, a germanium substrate, a silicon on insulator (SOI) substrate, etc. The upper portion of the substrate 100 may be patterned and first trenches TR1 extended in a second direction D2 may be formed. The first trenches TR1 may define first and second active patterns FN1 and FN2 at the upper portion of the substrate 100. The first and second patterns FN1 and FN2 may be arranged in a first direction D1.

The upper portion of the substrate 100 may be patterned to form a second trench TR2 defining a first active region PR and a second active region NR. During the forming of the second trench TR2, the active patterns FN1 and FN2 may be removed in a region where the second trench TR2 is formed. The first active patterns FN1 may be provided on the first active region PR, and the second active patterns FN2 may be provided on the second active region NR. The depth of the second trench TR2 may be greater than the depths of the first trenches TR1.

A device isolation layer ST that fills the first and second trenches TR1 and TR2 may be formed. The device isolation layer ST may be formed using silicon oxide. The forming of the device isolation layer ST may include forming an insulation layer that fills the first and second trenches TR1 and TR2 on a substrate 100, and recessing the insulation layer until upper portions of the first and second active patterns FN1 and FN2 are exposed.

Gate electrodes GE that cross the first and second active patterns FN1 and FN2 and extend in a first direction D1 may be formed. Gate dielectric layers GI may be formed under the gate electrodes GE. Gate spacers GS may be formed at both sides of each of the gate electrodes GE. On the gate electrodes GE, gate capping layers CP may be formed.

The formation of the gate electrodes GE may include forming sacrificial patterns crossing the first and second active patterns FN1 and FN2, forming gate spacers GS at both sides of each of the sacrificing patterns, and replacing the sacrificing patterns with the gate electrodes GE.

The gate electrodes GE may include at least one of conductive metal nitrides (e.g., titanium nitride or tantalum nitride) or metal materials (e.g., titanium, tantalum, tungsten, copper or aluminum). The gate dielectric layers GI may include a high dielectric material having a higher dielectric constant than a silicon oxide layer. The gate spacers GS may include at least one of SiCN, SiCON or SiN. The gate capping layers CP may include at least one of SiON, SiCN, SiCON or SiN. Channels CH1, CH2 may be disposed to penetrate the gate electrodes GE.

In the upper portions of the first active patterns FN1, first source/drain regions Sa1 may be formed. In the upper portions of the second active patterns FN2, second source/drain regions SD2 may be formed. The first and second source/drain regions SD1 and SD2 may be formed at both sides of each of the gate electrodes GE and the channel regions CH1, CH2. The first source/drain regions SD1 may be doped with p-type impurities and the second source/drain regions SD2 may be doped with n-type impurities. However, in other exemplary embodiments the first source/drain regions SD1 may be doped with n-type impurities and the second source/drain regions SD2 may be doped with p-type impurities.

The first and second source/drain regions SD1 and SD2 may be formed as epitaxial patterns by a selective epitaxial growth process. Particularly, the first and second active patterns FN1 and FN2 may be partially recessed at both sides of each of the gate electrodes GE. An epitaxial growth process may be performed on the recessed regions of the first and second active patterns FN1 and FN2.

A first interlayer insulating layer 110 may be formed on the entire surface of the substrate 100. The first interlayer insulating layer 110 may be formed as a silicon oxide layer or a silicon oxynitride layer. The top surface of the first interlayer insulating layer 110 may be coplanar with the top surfaces of the gate spacers GS and the top surfaces of the gate capping layers CP.

Figure 8A:
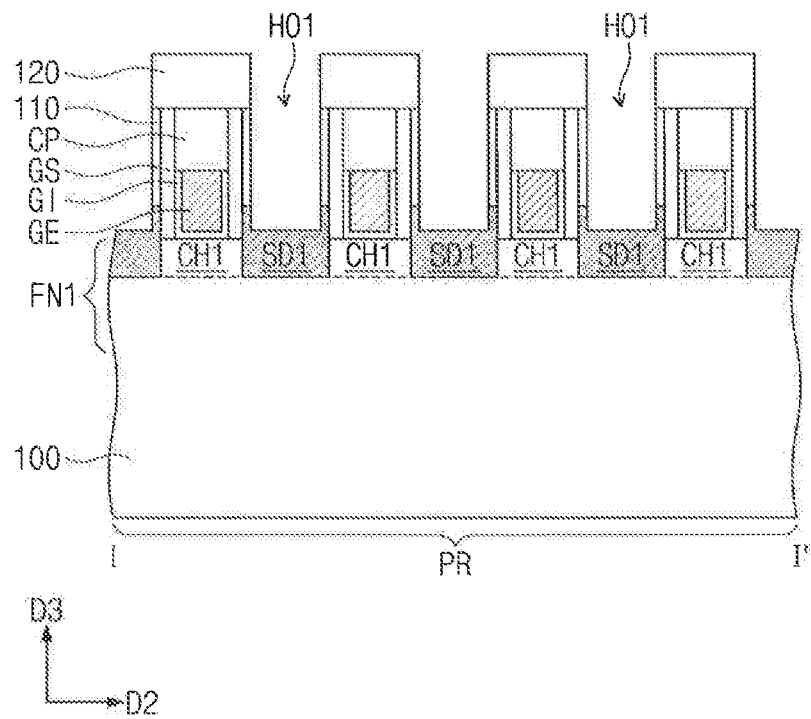
Figure 8B:
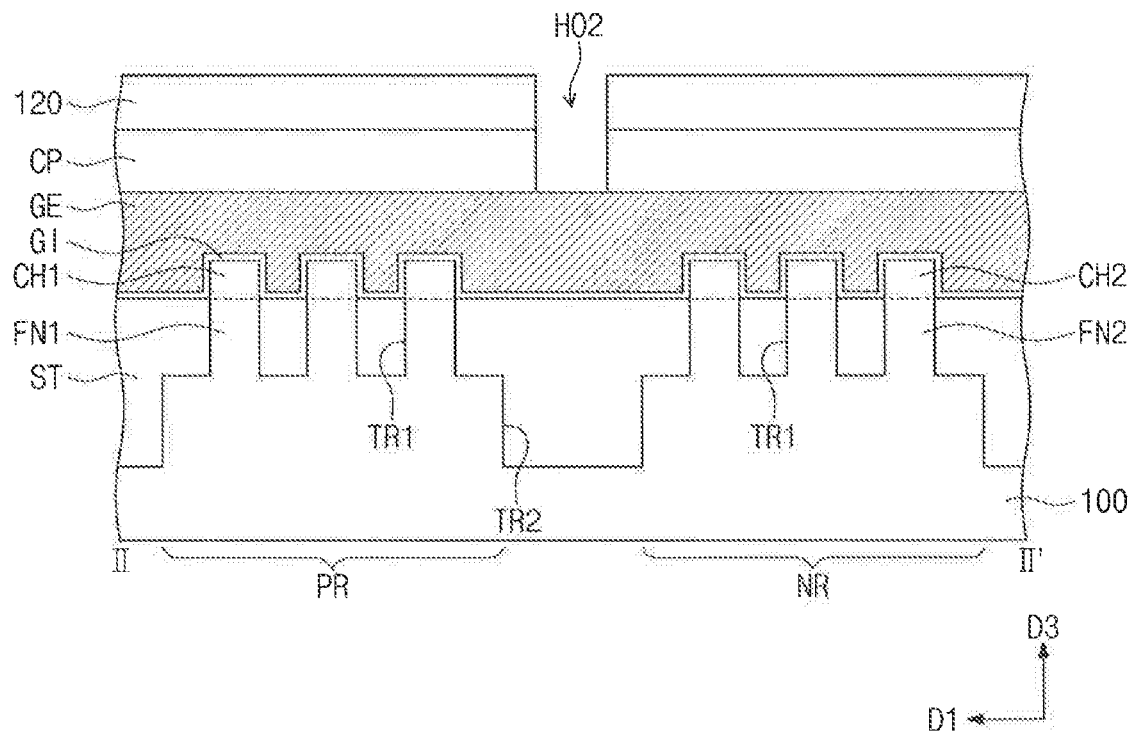
Figure 8C:
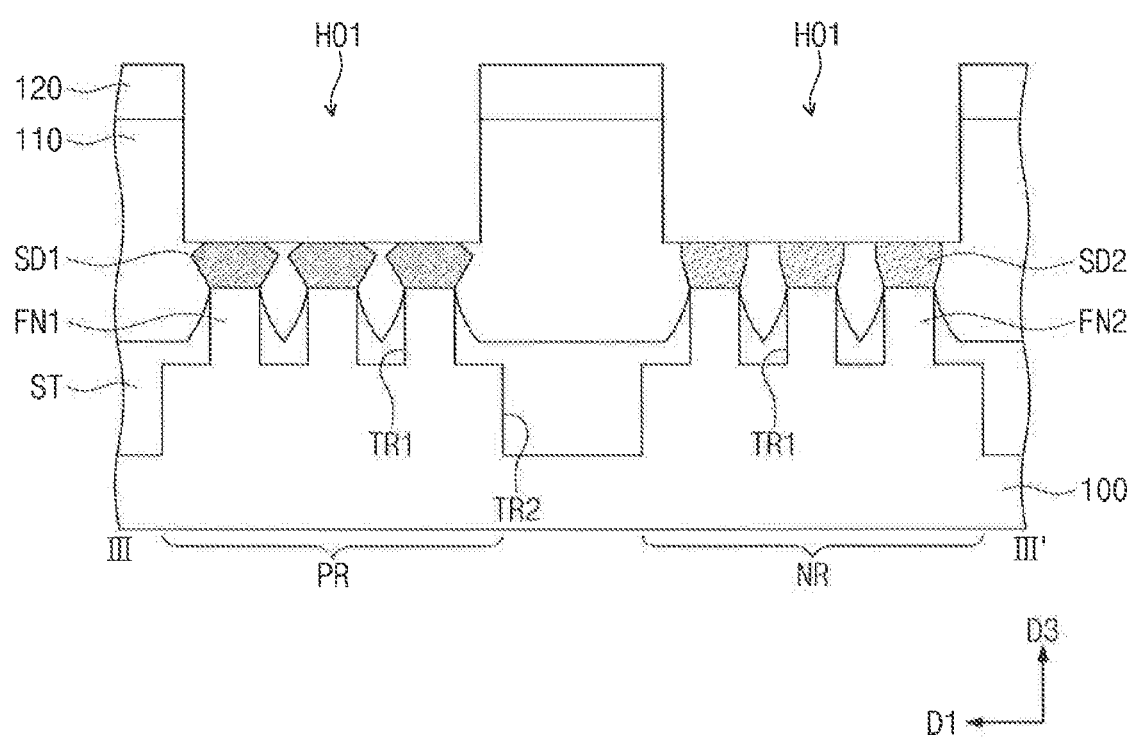
Figure 9:
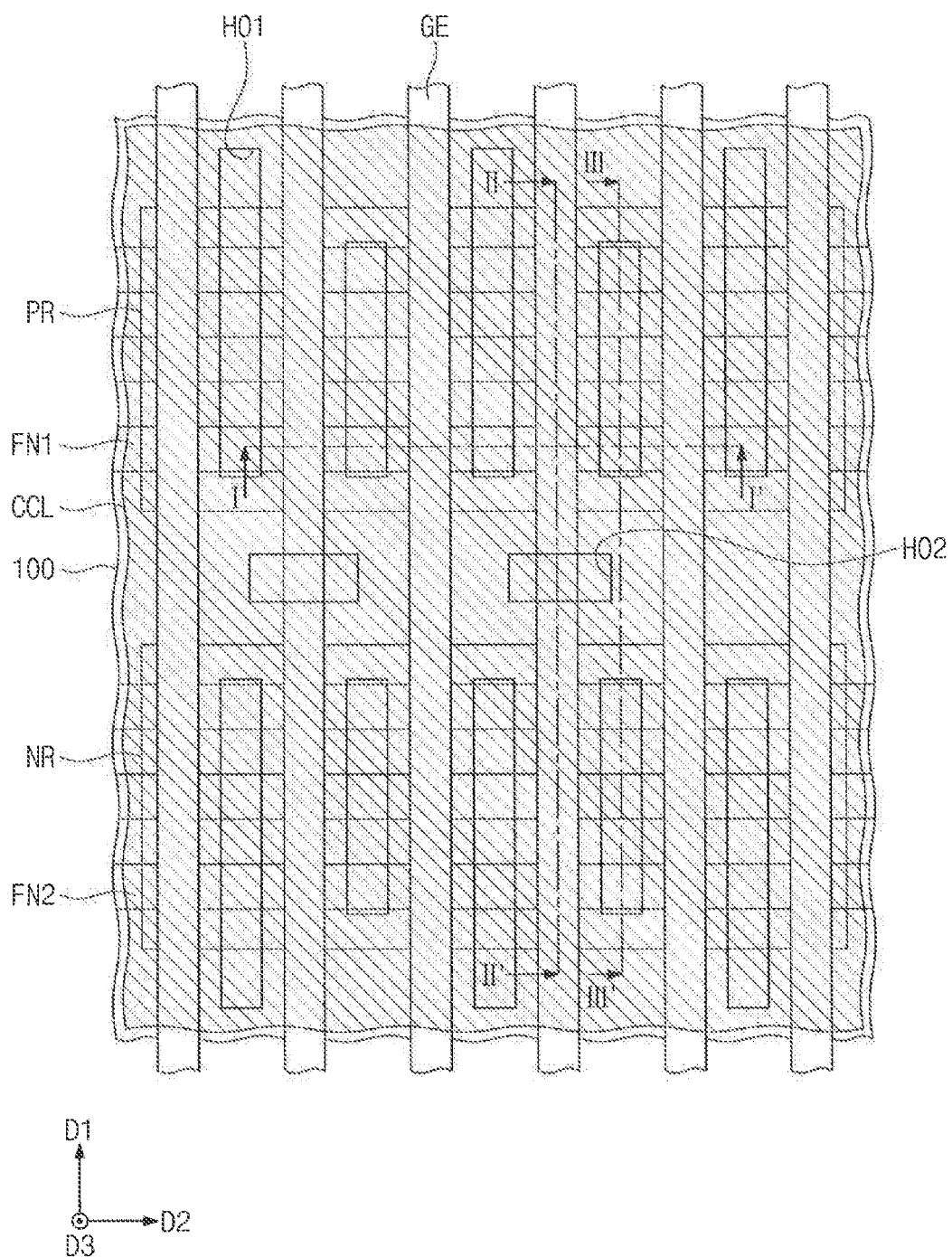
Figure 10A:
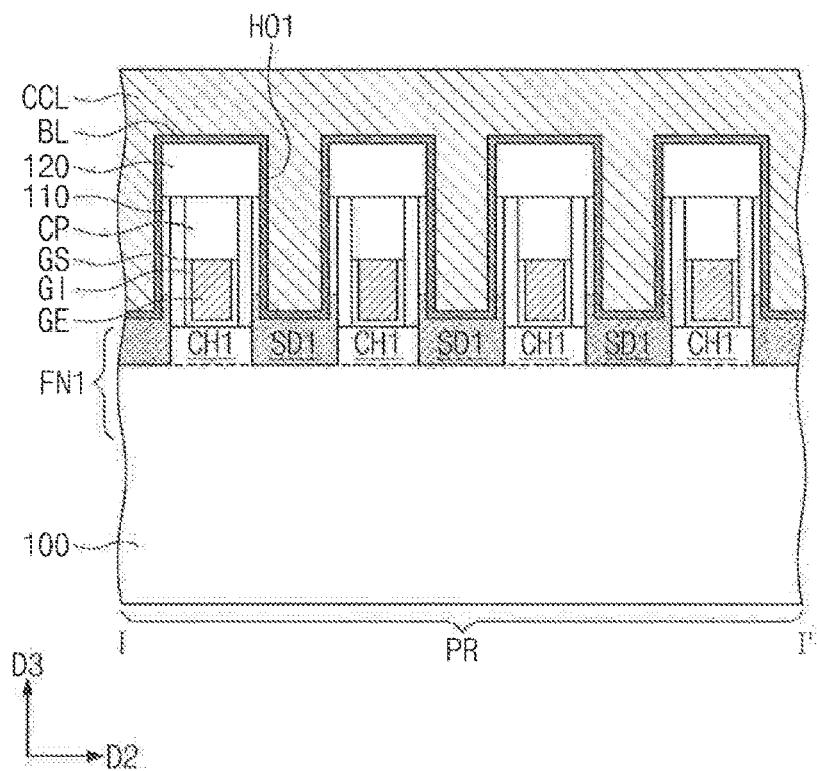
Figure 10B:
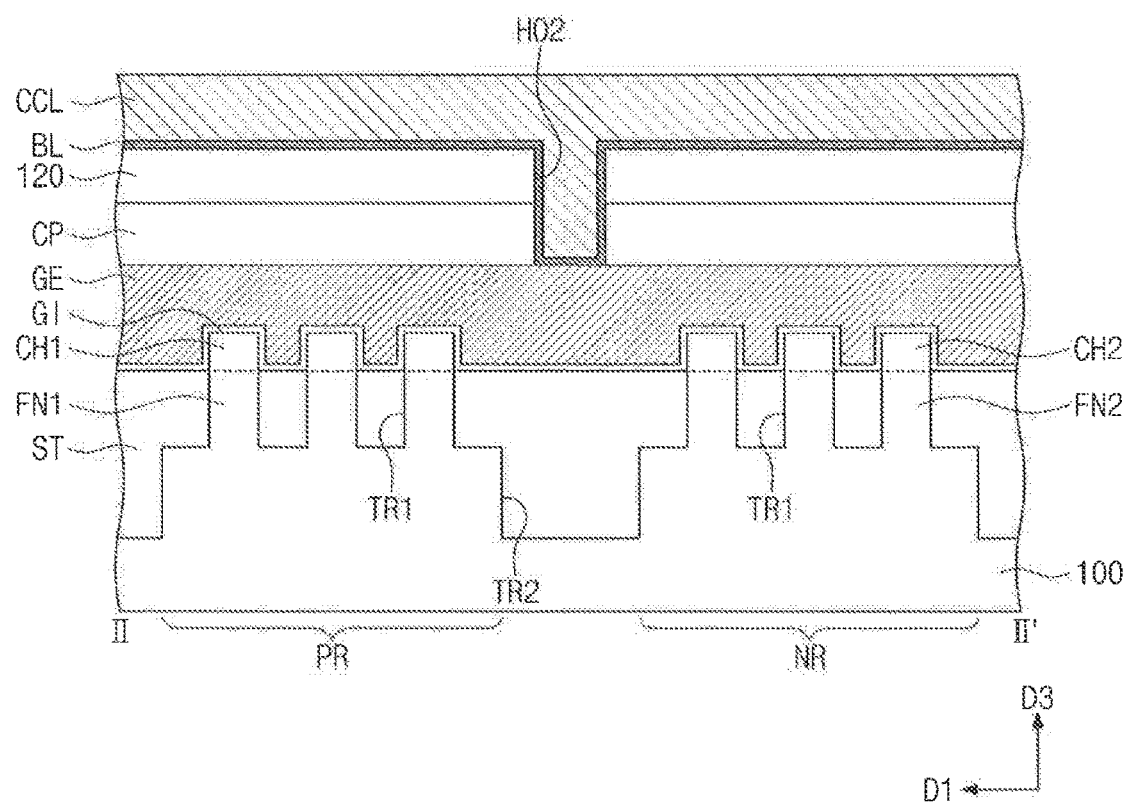
Figure 10C:
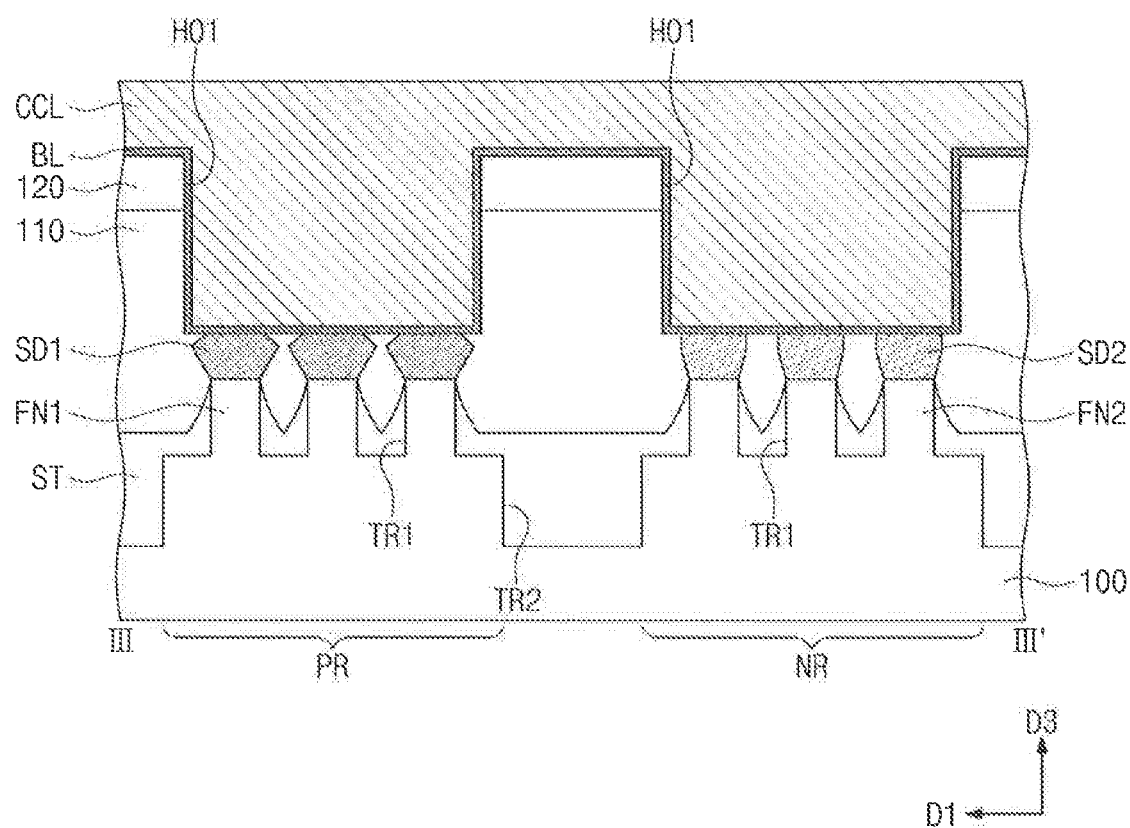
Figure 11:
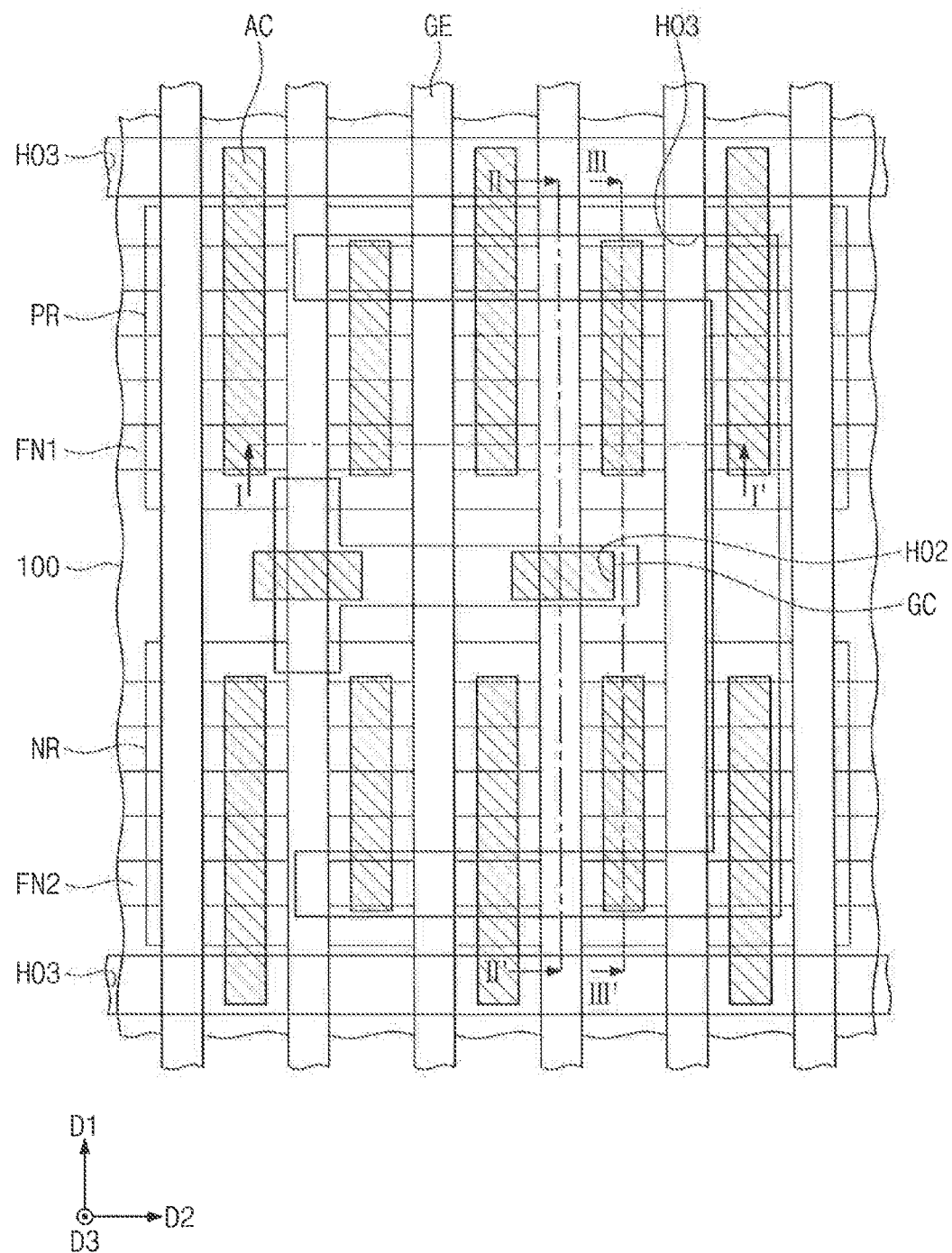
Figure 12A:
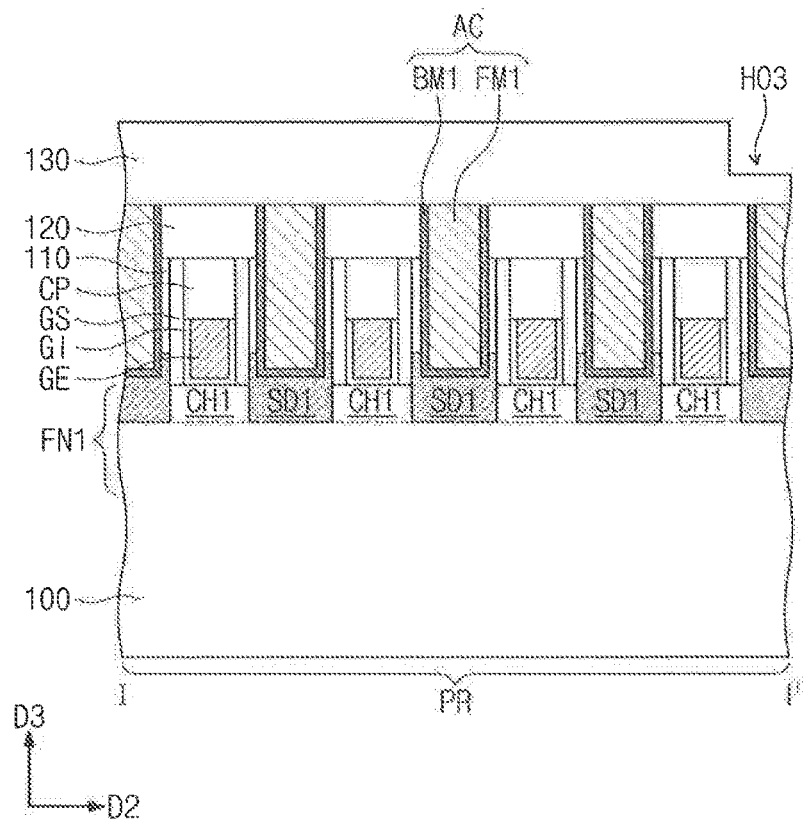
Figure 12B:
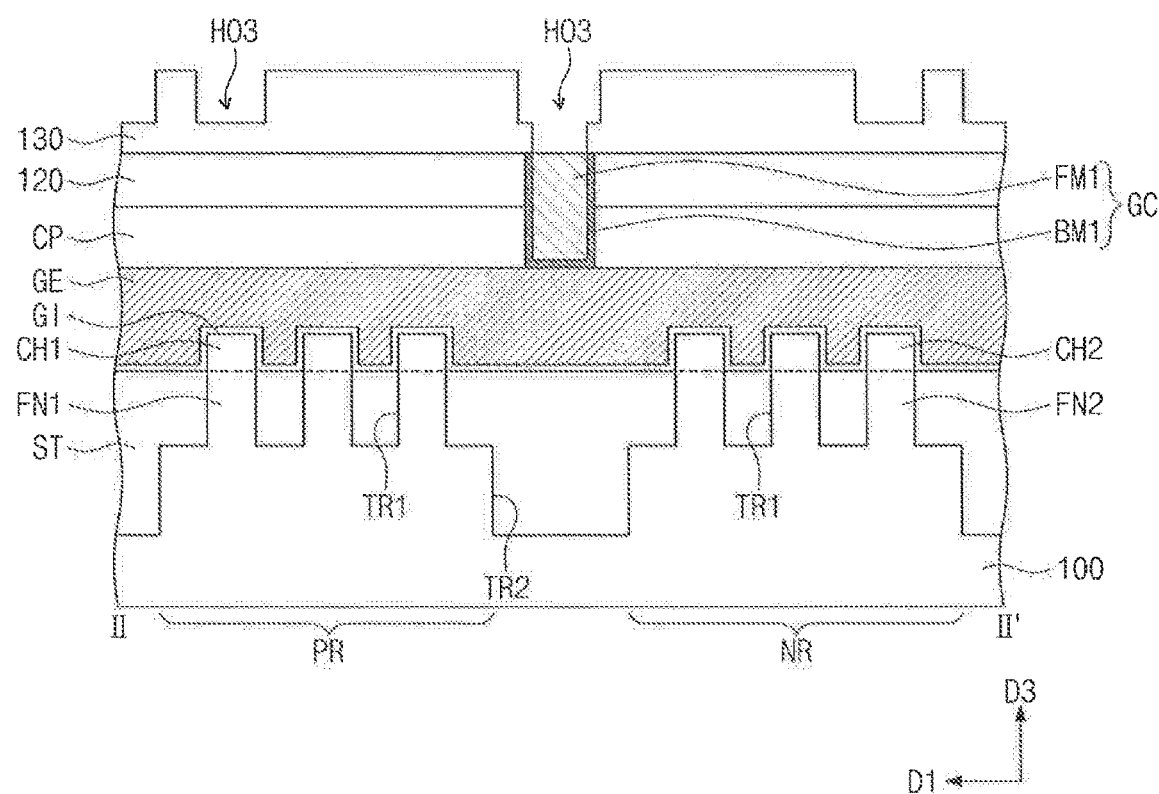
Figure 12C:
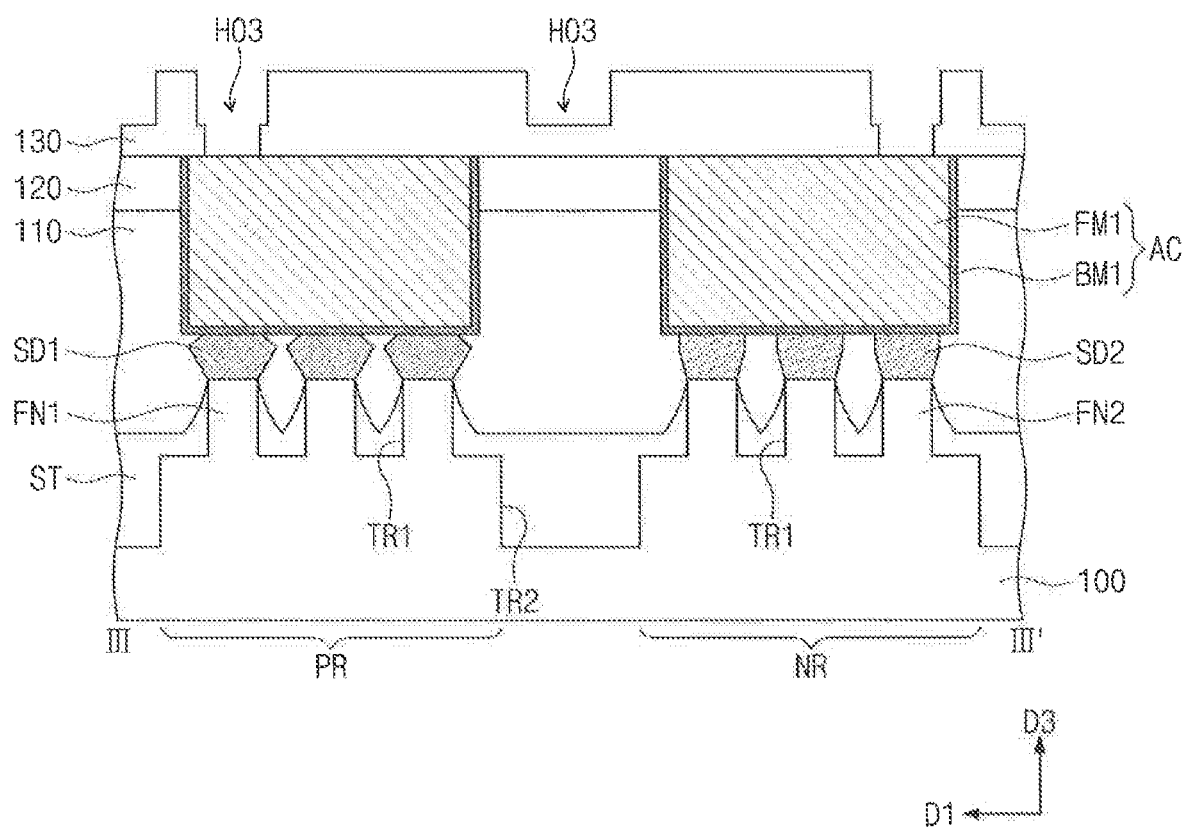

Referring to the exemplary embodiments shown in FIG. 7 and FIG. 8A to FIG. 8C, a second interlayer insulating layer 120 may be formed on the first interlayer insulating layer 110. First recesses HO1 penetrating the first and second interlayer insulating layers 110 and 120 may be thrilled. As shown in FIG. 8B, second recesses HO2 penetrating the second interlayer insulating layer 120 and the gate capping layers CF may be formed.

Each of the first recesses HO1 may be formed between neighboring gate electrodes GE. Each of the first recesses HO1 may expose the first source/drain regions SD1 or the second source/drain regions SD2. The second recesses HO2 may be formed to overlap the device isolation layer ST filling the second trench TR2. Each of the second recesses HO2 may expose at least a portion of the top surface of the gate electrode GE.

Referring to FIG. 9 and FIG. 10A to FIG. 10C, a barrier layer BL and a cobalt-containing layer CCL filling the first and second recesses HO1 and HO2 may be formed consecutively. For example, the barrier layer BL may be conformally formed on the substrate 100. The barrier layer BL may partially fill the first and second recesses HO1 and HO2. In an exemplary embodiment, the barrier layer EL may include at least one of a titanium nitride layer, a tungsten nitride layer or a tantalum nitride layer.

The cobalt-containing layer CCL may be formed on the barrier layer BL. The formation of the cobalt-containing layer CCL may utilize the manufacturing method of the cobalt-containing layer explained with reference to FIG. 1 to FIG. 4. For example, the cobalt-containing layer CCL may be formed by performing chemical vapor deposition (CVD) or atomic layer deposition (ALD) using a cobalt precursor selected from the group consisting of the compound of Formula 1 and the compound of Formula 2. In an exemplary embodiment, the cobalt-containing layer CCL may be formed to completely fill up the first and second recesses HO1 and HO2.

Referring to the exemplary embodiments shown in FIG. 11 and FIG. 12A to FIG. 12C, a planarization process may be performed on the cobalt-containing layer CCL and the barrier layer BL until the top surface of the second interlayer insulating layer 120 is exposed to form active contacts AC and gate contacts GC in the first recesses HO1 and the second recesses HO2, respectively. Each of the active contacts AC and the gate contacts GC may include a first barrier pattern BM1 and a first conductive pattern FM1.

A third interlayer insulating layer 130 may be formed on the second interlayer insulating layer 120. The third interlayer insulating layer 130 may be patterned to form third recesses HO3 in the third interlayer insulating layer 130. The third recesses HO3 may define interconnection lines and vias, which will be formed in subsequent processes.

Referring to the exemplary embodiments shown in FIG. 13 and FIG. 14A to FIG. 14C, interconnection lines IL filling the third recesses HO3 may be formed. Each of the interconnection lines IL may include a second barrier pattern BM2 and a second conductive pattern FM2.

Particularly, the formation of the interconnection lines IL may include forming a barrier layer on the substrate 100 and forming a cobalt-containing layer on the barrier layer. The formation of the interconnection lines IL may utilize the manufacturing method of the barrier layer BL and the cobalt-containing layer CCL explained with reference to FIG. 9 and FIG. 10A to FIG. 10C.

At least one of the interconnection lines IL may include a via VI. Through the via VI, the interconnection line IL may be electrically connected with at least one of the active contacts AC or the gate contacts GC.

Figure 13:
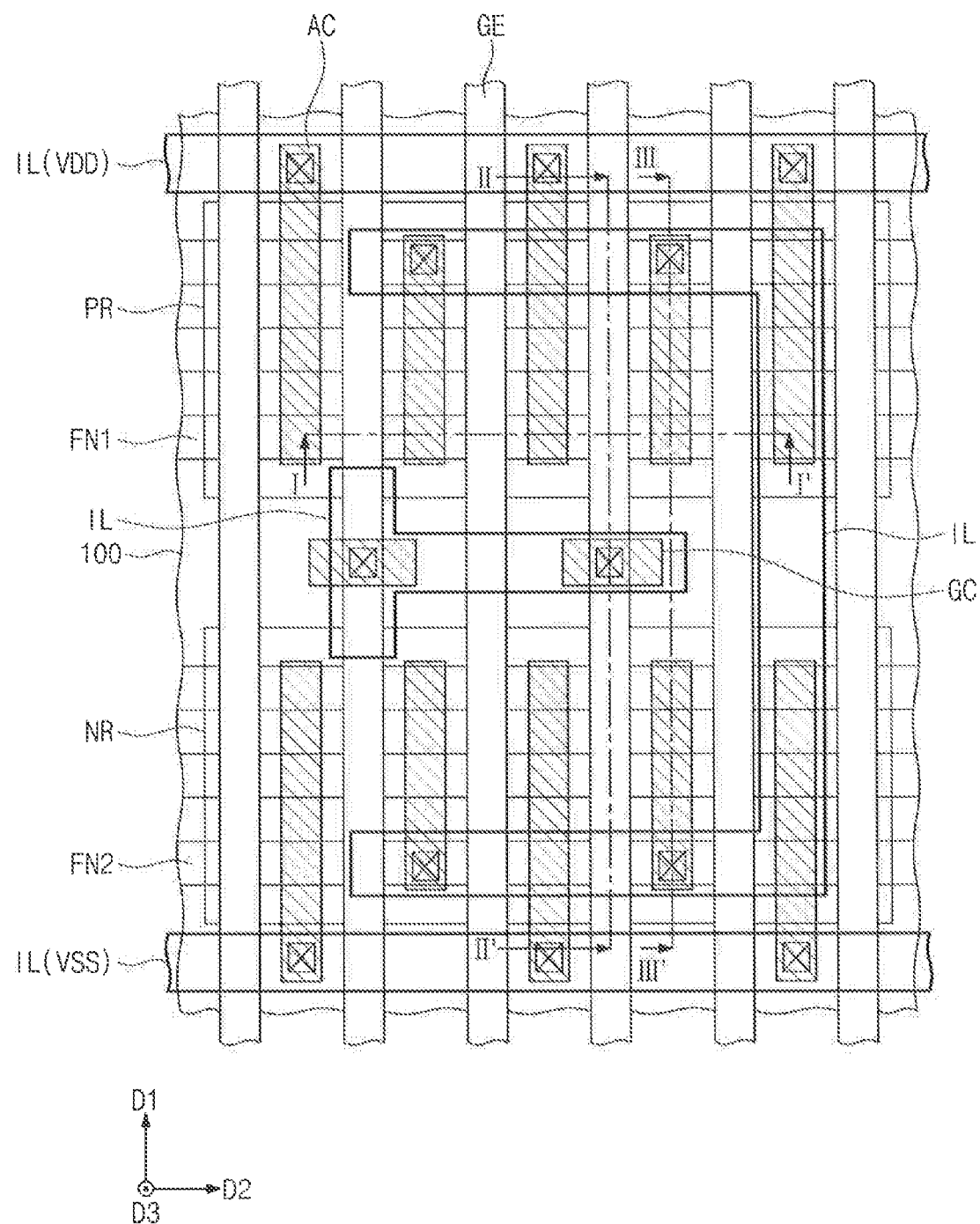
Figure 14A:
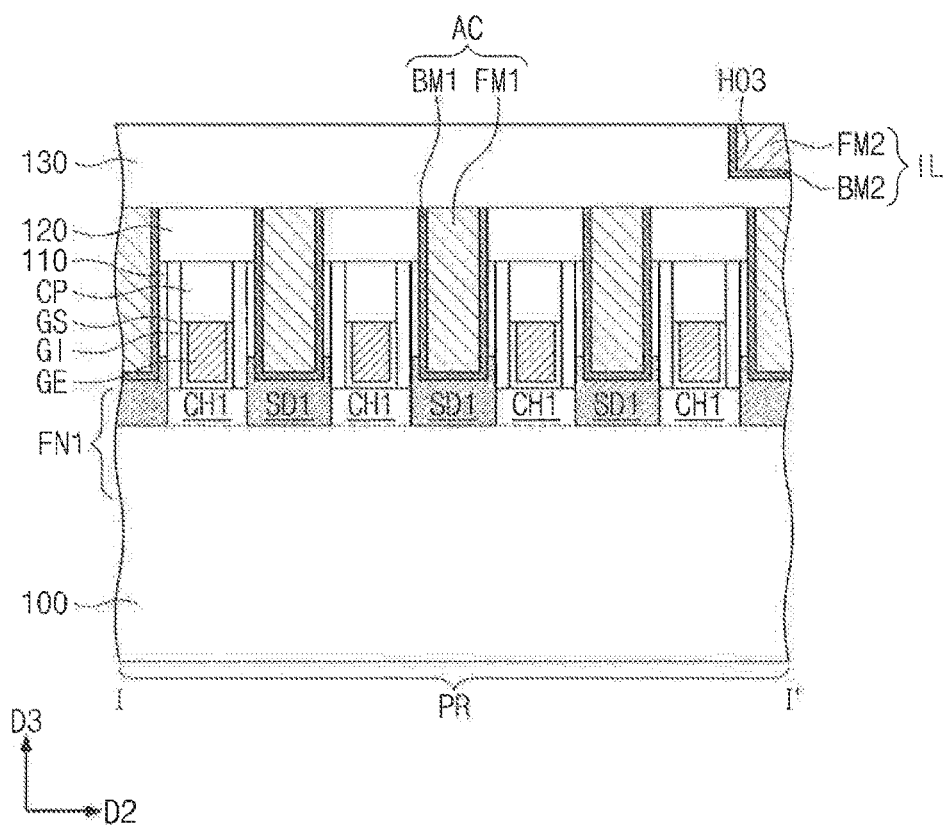
Figure 14B:
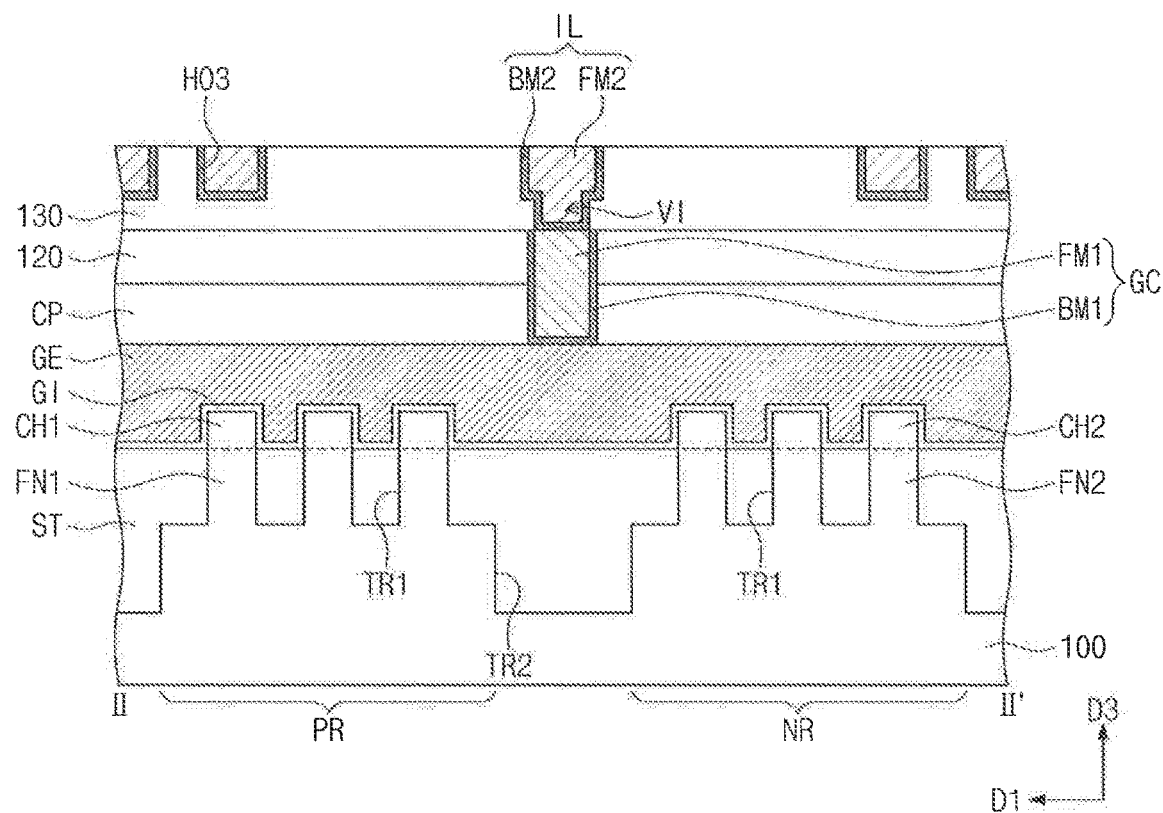
Figure 14C:
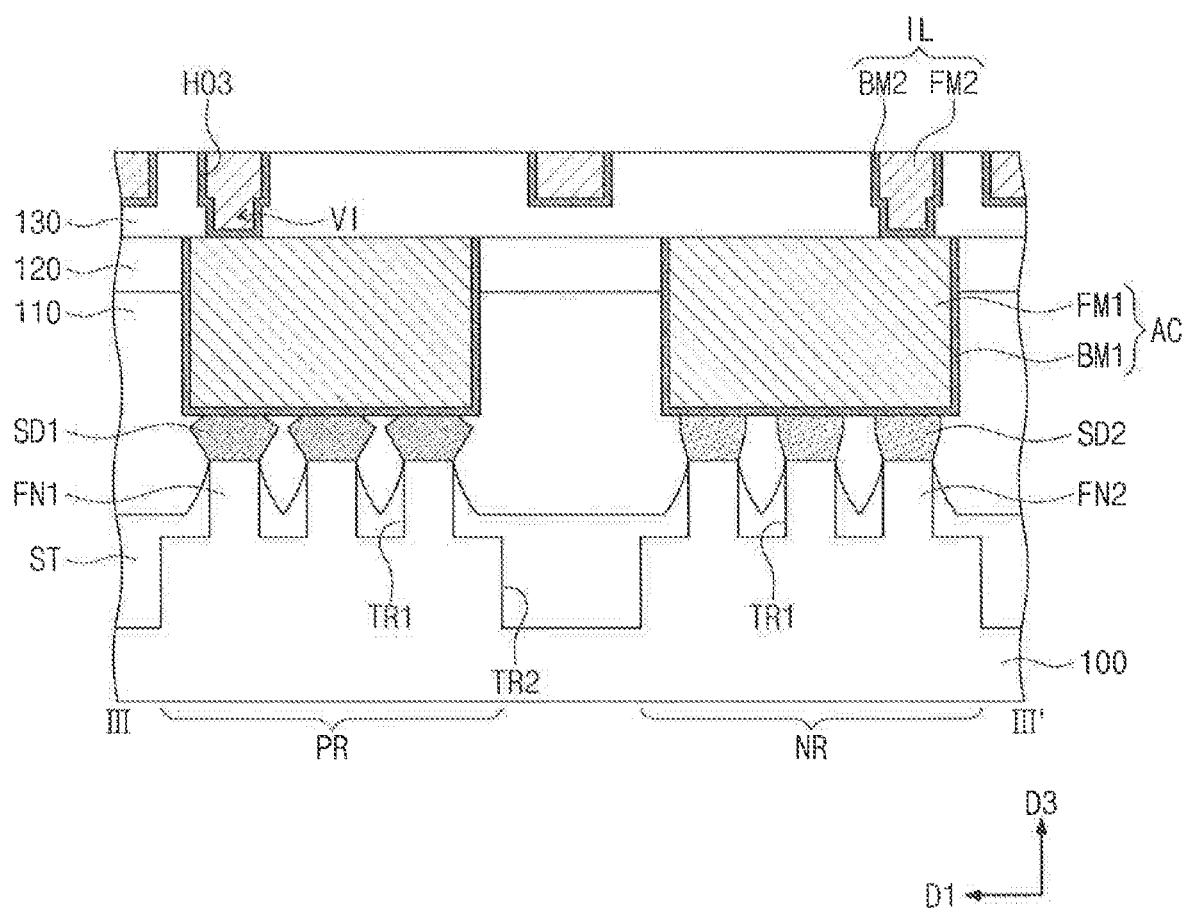
Figure 15:
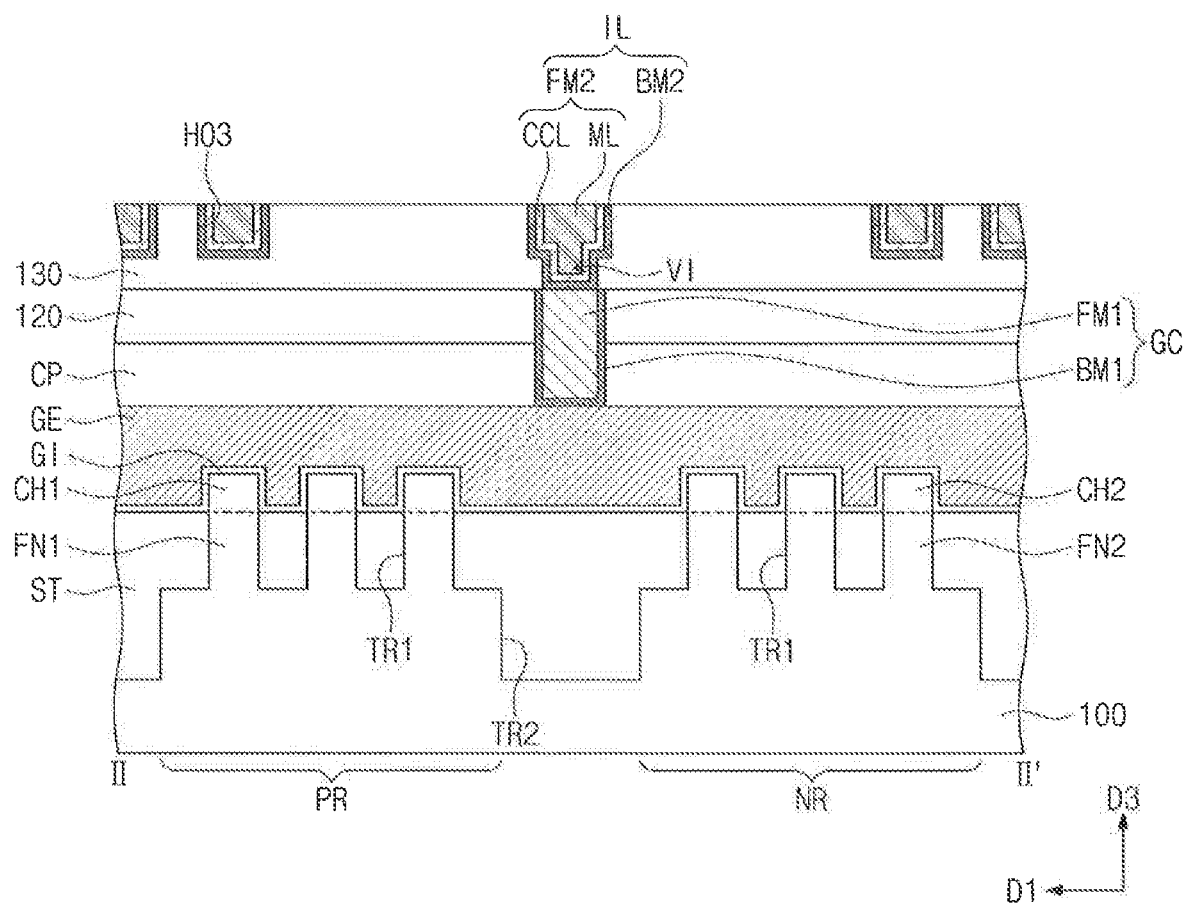
FIG. 15 is a cross-sectional view along line II-II' of the device of FIG. 13, according to an exemplary embodiment of the present inventive concepts.

FIG. 15 is a cross-sectional view along lines II-II' of the device of FIG. 13, according to an exemplary embodiment of the present inventive concepts. In this exemplary embodiment, detailed explanation on overlapping technical features with those in the explanation referring to FIG. 5 to FIG. 14C will be omitted, and different features will be explained in detail.

Referring to FIG. 13 and FIG. 15, each of the interconnection lines IL may include a second barrier pattern BM2 and a second conductive pattern FM2. The second conductive pattern FM may include a cobalt-containing layer CCL, and a metal layer ML on the cobalt-containing layer CCL.

The formation of the interconnection lines IL may include forming a barrier layer on third recesses HO3, forming a cobalt-containing layer CCL on the barrier layer, and forming a metal layer ML on the cobalt-containing layer CCL. In an exemplary embodiment, the metal layer ML may include a metal selected from a group consisting of aluminum, copper, tungsten and molybdenum. The cobalt-containing layer CCL may improve the adhesiveness between the second barrier pattern BM2 and the metal layer ML.

The method for manufacturing a cobalt-containing layer according to exemplary embodiments of the present inventive concepts may be used for the formation of the contact and the interconnection line of a logic device explained referring to FIG. 5 to FIG. 15. Further, the method for manufacturing a cobalt-containing layer according to exemplary embodiments of the present inventive concepts may be used for the formation of a metal line (e.g., bit lines and word lines) of a memory device. The method for manufacturing a cobalt-containing layer according to exemplary embodiments of the present inventive concepts may be used for the formation of an electrode of a lithium ion battery.

The method for manufacturing a cobalt-containing layer according to the present inventive concepts utilizes a novel cobalt precursor having a relatively high vapor pressure and may easily perform a deposition process at a low temperature. Further, the cobalt-containing layer manufactured according to the present inventive concepts has a small impurity (e.g., carbon) content, and improved electrical properties, such as low resistance properties.

Although the exemplary embodiments of the present inventive concepts have been described, it is understood that the present invention should not be limited to these exemplary embodiments but various changes and modifications can be made by one ordinary skilled in the art within the spirit and scope of the present invention as hereinafter claimed.

What is claimed is:

1. A method for manufacturing a cobalt-containing layer on a substrate, the method comprising:
performing a deposition process using a cobalt precursor comprising at least one compound selected from the group consisting of a compound of Formula 1 and a compound of Formula 2:

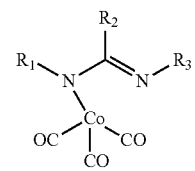

[Formula 1]

wherein R1 and R3 are each independently substituted or unsubstituted, linear or branched (C1-C6)alkyl, and
R2 is hydrogen, or substituted or unsubstituted, linear or branched (C1-C6)alkyl,

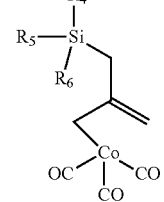

[Formula 2]

wherein R4, R5 and R6 are each independently substituted or unsubstituted, linear or branched (C1-C6)alkyl.

2. The method for manufacturing a cobalt-containing layer of claim 1, wherein the deposition process comprises:
vaporizing the cobalt precursor in a container; and
supplying the vaporized cobalt precursor through a carrier gas into a process chamber which includes the substrate.

3. The method for manufacturing a cobalt-containing layer of claim 2, wherein the vaporization of the cobalt precursor is performed at a temperature of about 0° C. to about 40° C.

4. The method for manufacturing a cobalt-containing layer of claim 1, wherein the deposition process comprises thermal chemical vapor deposition (CVD), plasma-enhanced (PE) CVD, photo CVD, photoplasma CVD or atomic layer deposition (ALD).

5. The method for manufacturing a cobalt-containing layer of claim 1, wherein the deposition process comprises supplying a reactant gas into a process chamber, and the reactant gas is at least one selected from the group consisting of hydrogen ($H_2$), oxygen ($O_2$), ozone ($O_3$), nitrogen dioxide ($NO_2$), nitrogen monoxide (NO), vapor ($H_2O$), hydrogen peroxide ($H_2O_2$), acetic acid, hydrazine ($N_2H_4$), ammonia ($NH_3$), silane ($SiH_4$), boran ($BH_3$), diboran ($B_2H_6$) and phosphine ($PH_3$).

6. The method for manufacturing a cobalt-containing layer of claim 1, wherein the deposition process comprises:
supplying the cobalt precursor on an intermediate layer on the substrate to form the cobalt-containing layer on the intermediate layer, and
the intermediate layer comprises a silicon oxide layer, a silicon nitride layer, a copper oxide layer, a titanium nitride layer, a titanium oxide layer, a tantalum nitride layer, a tantalum oxide layer, a ruthenium oxide layer, a zirconium oxide layer, a hafnium oxide layer or a lanthanum oxide layer.

7. The method for manufacturing a cobalt-containing layer of claim 1, wherein:
R1 and R3 are each independently branched (C3-C4) alkyl, and
R2 is (C1-C2)alkyl.

8. The method for manufacturing a cobalt-containing layer of claim 1, wherein R4, R5 and R6 are each independently (C1-C3)alkyl.

9. A method for manufacturing a semiconductor device, the method comprising:
forming an interlayer insulating layer on a substrate;
patterning the interlayer insulating layer to form a recess; and
forming a cobalt-containing layer on the recess,
wherein the forming of the cobalt-containing layer comprises performing a deposition process using a cobalt precursor comprising at least one compound selected from the group consisting of a compound of Formula 1 and a compound of Formula 2:

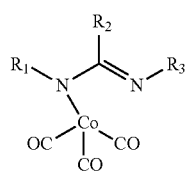

[Formula 1]

wherein R1 and R3 are each independently substituted or unsubstituted, linear or branched (C1-C6)alkyl, and
R2 is hydrogen, or substituted or unsubstituted, linear or branched (C1-C6)alkyl,

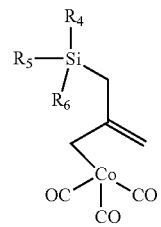

[Formula 2]

wherein R4, R5 and R6 are each independently substituted or unsubstituted, linear or branched (C1-C6)alkyl.

10. The method for manufacturing a semiconductor device of claim 9, further comprising: forming a barrier layer directly on the recess and forming the cobalt-containing layer on the barrier layer,
wherein the barrier layer comprises at least one of a titanium nitride layer, a tungsten nitride layer or a tantalum nitride layer.

11. The method for manufacturing a semiconductor device of claim 9, further comprising:
forming a metal layer on the cobalt-containing layer,
wherein the metal layer comprises a metal selected from the group consisting of aluminum, copper, tungsten and molybdenum.

12. The method for manufacturing a semiconductor device of claim 9, further comprising:
patterning an upper portion of the substrate to form an active pattern;
forming a gate electrode crossing the active pattern; and
forming a source/drain region in an upper portion of the active pattern,
wherein the recess exposes the gate electrode or the source/drain region.

13. The method for manufacturing a semiconductor device of claim 9, further comprising:
forming transistors on the substrate; and
forming contacts connected to the transistors,
wherein the interlayer insulating layer covers the contacts, and
the recess exposes at least one of the contacts.

14. The method for manufacturing a semiconductor device of claim 9, wherein:
R1 and R3 are each independently branched (C3-C4) alkyl, and
R2 is (C1-C2)alkyl.

15. The method for manufacturing a semiconductor device of claim 9, wherein R4, R5 and R6 are each independently (C1-C3)alkyl.

* * * * *